(12) United States Patent
Higashi et al.

(10) Patent No.: US 11,817,327 B2
(45) Date of Patent: Nov. 14, 2023

(54) SEMICONDUCTOR DEVICE AND MANUFACTURING METHOD THEREOF

(71) Applicant: FUJI ELECTRIC CO., LTD., Kawasaki (JP)

(72) Inventors: Nobuhiro Higashi, Matsumoto (JP); Akira Furuta, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 152 days.

(21) Appl. No.: 17/461,579

(22) Filed: Aug. 30, 2021

(65) Prior Publication Data

US 2022/0115246 A1  Apr. 14, 2022

(30) Foreign Application Priority Data

Oct. 14, 2020  (JP) .................................. 2020-173589

(51) Int. Cl.
*H01L 21/56* (2006.01)
*H01L 23/495* (2006.01)
(Continued)

(52) U.S. Cl.
CPC ...... *H01L 21/565* (2013.01); *H01L 23/49575* (2013.01); *H01L 23/50* (2013.01);
(Continued)

(58) Field of Classification Search
CPC . H01L 21/565; H01L 23/49575; H01L 23/50; H01L 24/05; H01L 24/48; H01L 25/07; H01L 25/18; H01L 2224/05553; H01L 2224/48091; H01L 25/072; H01L 25/50; H01L 24/29; H01L 24/32; H01L 24/49; H01L 24/73; H01L 24/83; H01L 24/92; H01L 2224/29101; H01L 2224/32245; H01L 2224/45015; H01L 2224/45124; H01L 2224/45139; H01L 2224/45144; H01L 2224/45147; H01L 2224/48137; H01L 2224/48247; H01L 2224/4903; H01L 2224/49171;
(Continued)

(56) References Cited

U.S. PATENT DOCUMENTS

| 6,002,166 | A | 12/1999 | Noda et al. |
| 2005/0082690 | A1 | 4/2005 | Hayashi et al. |
| 2017/0294369 | A1* | 10/2017 | Kawashima ............ H01L 24/32 |

FOREIGN PATENT DOCUMENTS

| EP | 0910121 A1 | 4/1999 |
| JP | 2005-123495 A | 5/2005 |

(Continued)

*Primary Examiner* — Robert G Bachner
(74) *Attorney, Agent, or Firm* — Rabin & Berdo, P.C.

(57) ABSTRACT

A manufacturing method of a semiconductor device includes sealing a metal plate on which a semiconductor chip and a control IC are mounted by injecting molding resin raw material into a cavity from an inlet, filling the cavity with the molding resin raw material, and discharging excessive molding resin raw material from an outlet. In the case of the semiconductor device manufactured in this way, at least, generation of voids is reduced in an area around the semiconductor chip and the control IC. Thus, occurrence of an electrical discharge in the semiconductor device is reduced, and deterioration of the reliability of the semiconductor device is prevented.

17 Claims, 13 Drawing Sheets

(51) Int. Cl.
*H01L 23/50* (2006.01)
*H01L 25/18* (2023.01)
*H01L 23/00* (2006.01)
*H01L 25/07* (2006.01)

(52) U.S. Cl.
CPC .............. *H01L 24/05* (2013.01); *H01L 24/48* (2013.01); *H01L 25/07* (2013.01); *H01L 25/18* (2013.01); *H01L 2224/05553* (2013.01); *H01L 2224/48091* (2013.01)

(58) Field of Classification Search
CPC . H01L 2224/73265; H01L 2224/83801; H01L 2224/92247; H01L 2924/14; H01L 2924/181; H01L 2924/1815; H01L 23/3107; H01L 23/49541; H01L 23/49551; H01L 23/49562; B29C 45/14
See application file for complete search history.

(56) References Cited

FOREIGN PATENT DOCUMENTS

WO           98/24122 A1    6/1998
WO    2016/072012 A1    5/2016

\* cited by examiner

SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2020-173589, filed on Oct. 14, 2020, the entire contents of which are incorporated herein by reference.

BACKGROUND OF THE INVENTION

1. Field of the Invention

The embodiment discussed herein relates to a semiconductor device and a manufacturing method thereof.

2. Background of the Related Art

A semiconductor device includes semiconductor chips, control integrated circuits (ICs), main current lead frames including main die pad portions on which the semiconductor chips are disposed, and control lead frames including control die pad portions on which the control ICs are disposed. In addition, the semiconductor chips, the control ICs, the main die pad portions, and the control die pad portions of the semiconductor device are sealed by sealing material. The semiconductor chips include switching elements and diode elements as power devices. The switching elements are, for example, insulated gate bipolar transistors (IGBTs) or power metal-oxide-semiconductor field-effect transistors (MOSFETs). The diode elements are, for example, Schottky barrier diodes (SBDs) or P-intrinsic-N (PiN) diodes as free wheeling diodes (FWDs). The control ICs control the driving of the switching elements.

The semiconductor device as described above is manufactured through the following steps. First, the semiconductor chips are disposed on the main die pad portions, and the control ICs are disposed on the control die pad portions. Next, the main current lead frames including the main die pads and the control lead frames including the control die pads are disposed in the cavity of a mold. Next, liquid sealing resin is injected into the mold to seal the mold, and the sealing resin is solidified. Next, the semiconductor device is obtained by removing the mold (see, for example, Japanese Laid-open Patent Publication No. 2005-123495).

In accordance with the above semiconductor device manufacturing method, when the liquid sealing resin is injected into the cavity, the sealing resin fills the cavity while flowing inside the cavity. In the process of this filling, the flow of the sealing resin could stagnate at some portions. These stagnated portions include voids. If the sealing resin that has filled the cavity is solidified with voids, the sealing resin of the obtained semiconductor device also includes the voids. In particular, if a high voltage application portion of the semiconductor device includes voids, these voids could cause an electrical discharge.

SUMMARY OF THE INVENTION

In one aspect of an embodiment, there is provided a semiconductor device manufacturing method including: preparing molding resin raw material, a mold including a storage portion having a rectangular shape in a plan view and surrounded by one long side, one short side, another long side, and another short side in this order, an inlet for the molding resin raw material formed on the one long side near the another short side, and an outlet for the molding resin raw material formed on the one short side near the another long side, a metal plate including a first main die pad portion formed near the one long side of the storage portion in a plan view, a first main current terminal portion integrally connected with the first main die pad portion and extending from the one long side to an outside of the storage portion, a first control die pad portion formed between the first main die pad portion of the storage portion and the another long side, and a first control terminal portion integrally connected with the first control die pad portion and extending from the another long side to the outside of the storage portion, a first semiconductor chip, and a first control element; mounting the first semiconductor chip on the first main die pad portion and mounting the first control element on the first control die pad portion; disposing the metal plate in the mold such that the first semiconductor chip and the first control element are stored in the storage portion in a plan view; and sealing the metal plate on which the first semiconductor chip and the first control element are mounted by injecting the molding resin raw material into the storage portion from the inlet, filling the storage portion with the molding resin raw material, and discharging excessive molding resin raw material from the outlet.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. In the following description, regarding a semiconductor device 10 in FIGS. 1A, 1B, and 2, terms "front surface" and "top surface" each mean an upward surface. Likewise, regarding the semiconductor device 10 in FIGS. 1A, 1B, and 2, a term "up" means an upward direction. In addition, regarding the semiconductor device 10 in FIGS. 1A, 1B, and 2, terms "rear surface" and "bottom surface" each mean a downward surface. Likewise, regarding the semiconductor device 10 in FIGS. 1A, 1B, and 2, a term "down" means a downward direction. In the other drawings, too, the above terms mean their respective directions, as needed. The terms "front surface", "top surface", "up", "rear surface", "bottom surface", "down", and "side surface" are only expressions used for the purpose of convenience to determine relative positional relationships and do not limit the technical concept of the embodiment. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component will be referred to as its "main component" of the material.

Figure 1A:
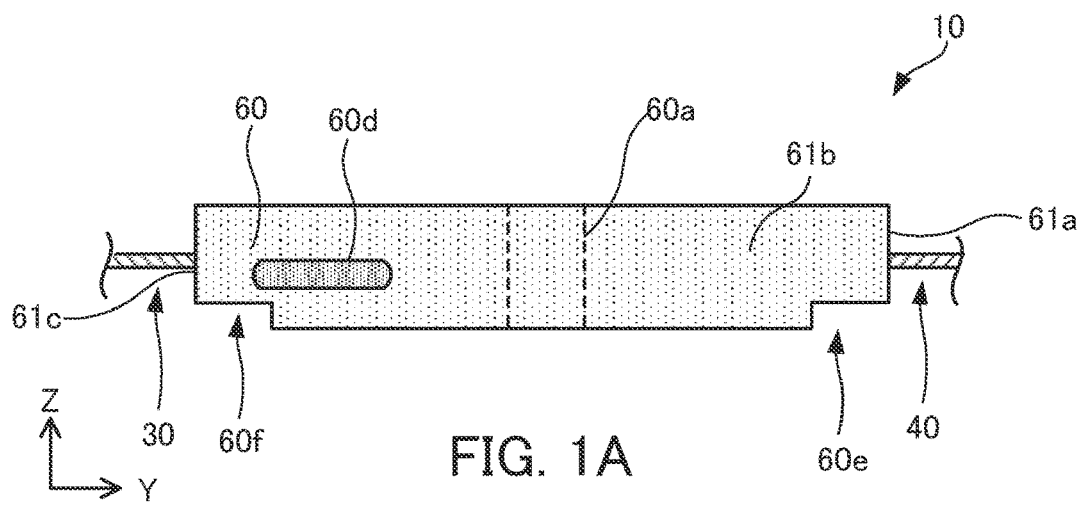
FIGS. 1A and 1B are each an external view of a semiconductor device according to an embodiment.
Figure 1B:
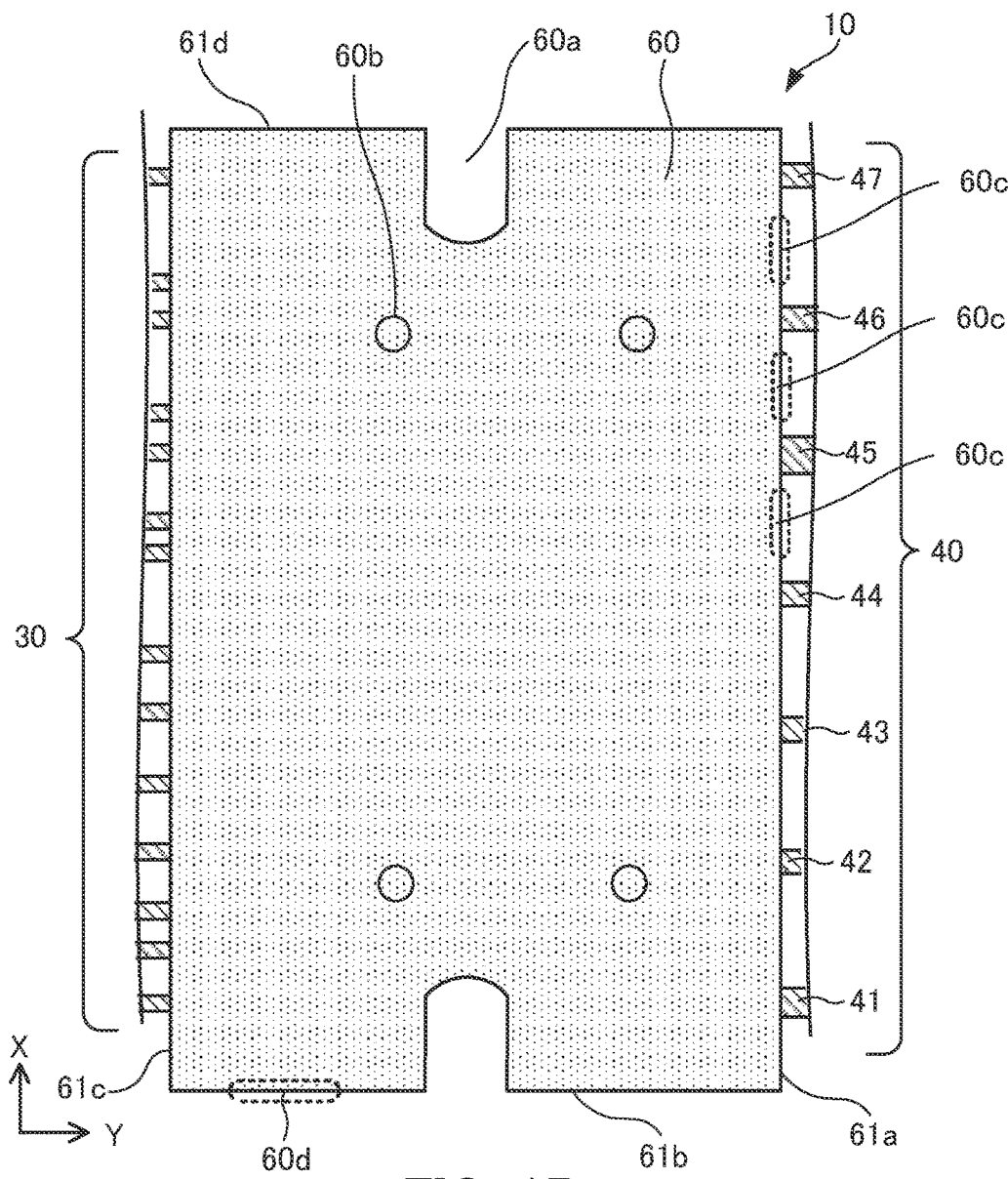
Figure 2:
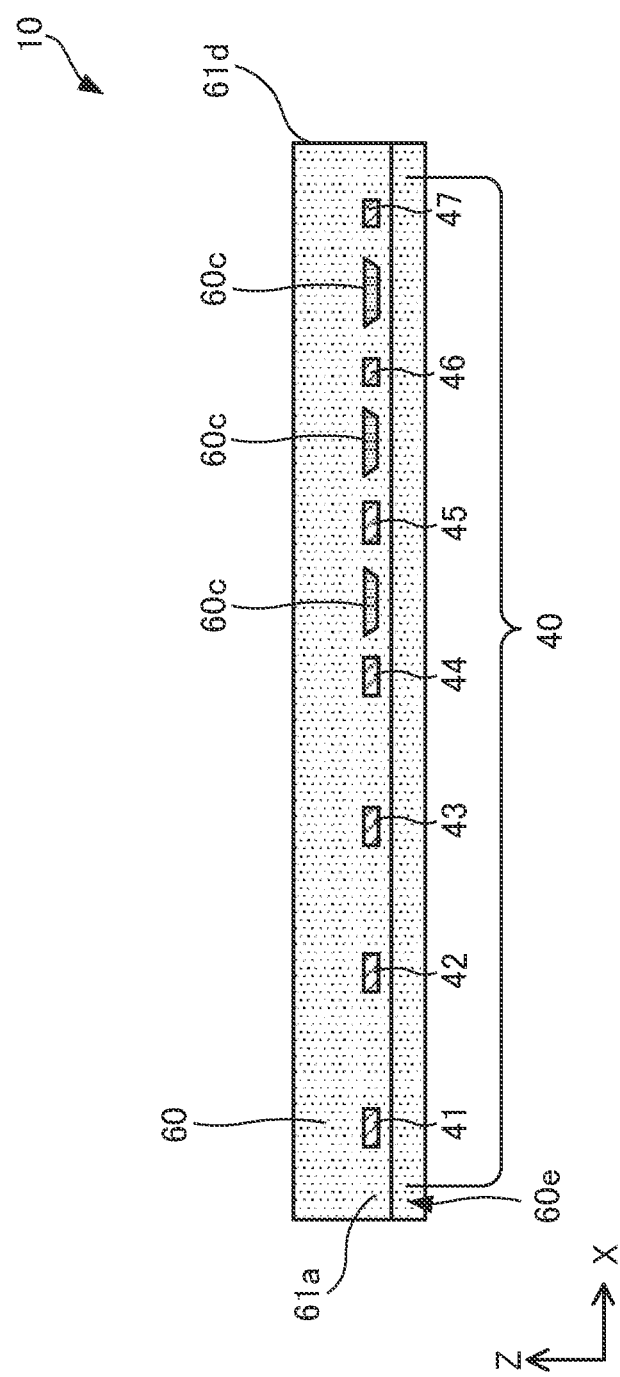
FIG. 2 is a side view of the semiconductor device according to the embodiment.
Figure 3:
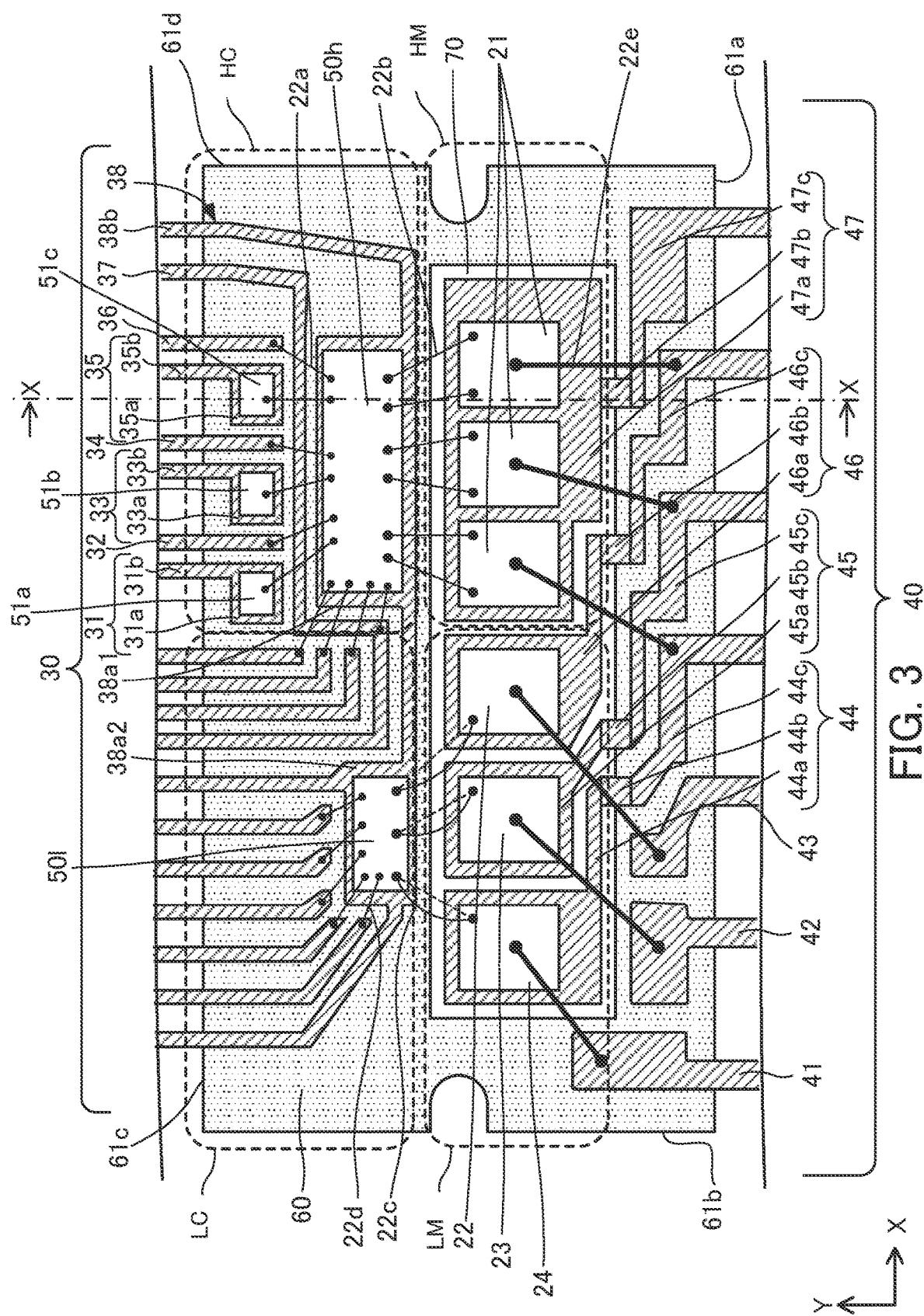
FIG. 3 is a plan view of the semiconductor device according to the embodiment.
Figure 4:
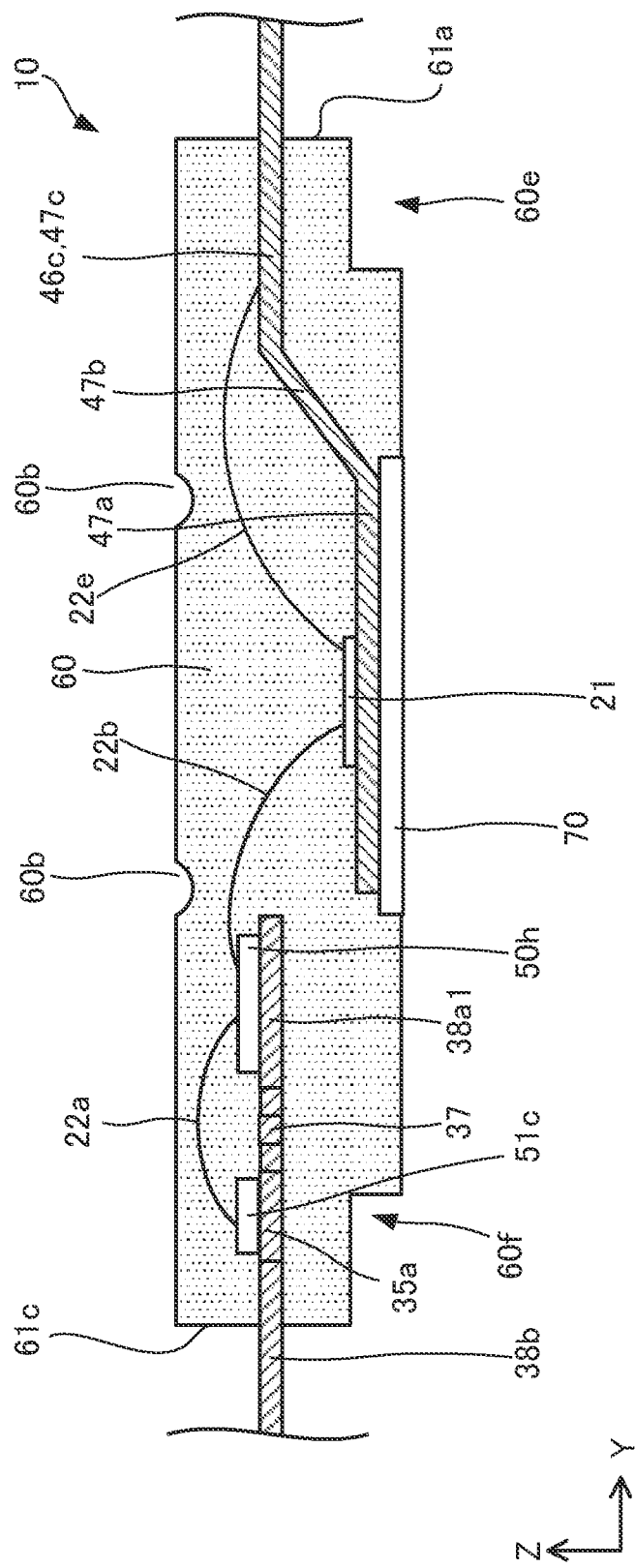
FIG. 4 is a longitudinal sectional view of the semiconductor device according to the embodiment.

The semiconductor device 10 according to the embodiment will be described with reference to FIGS. 1A to 4. FIGS. 1A and 1B are each an external view of the semiconductor device 10 according to the embodiment, and FIG. 2 is a side view of the semiconductor device 10 according to the embodiment. FIG. 1A is a side view of the semiconductor device 10 in FIG. 1B in an X direction. FIG. 1B illustrates a front surface of the semiconductor device 10. FIG. 2 illustrates a side surface of the semiconductor device 10 in FIG. 1B seen from a −Y direction. FIG. 3 is a plan view of the semiconductor device 10 according to the embodiment, and FIG. 4 is a longitudinal sectional view of the semiconductor device 10 according to the embodiment. The arrangement of internal components of the semiconductor device 10, which are seen from the front surface thereof, is illustrated in FIG. 3. FIG. 4 is a sectional view illustrating the depth from a dashed-dotted line X-X in FIG. 3. That is, FIG. 4 illustrates components arranged in the X direction from the dashed-dotted line X-X.

First, as illustrated in FIGS. 1A and 1B, components of the semiconductor device 10 as a whole are sealed by molding resin 60 such that the semiconductor device 10 will be formed in a cubic shape. While the molding resin of the semiconductor device 10 has a cubic shape, its corner portions may have a curvature. In addition, the molding resin 60 has a rectangular shape in a plan view, and four sides of the molding resin 60 are surrounded by a pair of opposite long side surfaces (first and second long mold sides) 61a and 61c and a pair of opposite short side surfaces (third and fourth short mold sides) 61b and 61d. That is, four sides of the molding resin 60 are surrounded by one long side surface 61a, one short side surface 61b, the other long side surface 61c, and the other short side surface 61d in this order. The front surface of the semiconductor device 10 is covered by the molding resin 60. That is, a rear surface of an insulating sheet 70 is exposed to the outside from a rear surface of the molding resin 60. The rear surface of the insulating sheet 70 and the rear surface of the molding resin 60 are on the same plane. In addition, in the case of this semiconductor device 10, a plurality of control lead frames 30 extend from the long side surface 61c of the molding resin 60, and a plurality of main current lead frames 40 extend from the long side surface 61a of the molding resin 60. In this case, main current lead frames 41 to 47 are arranged on the long side surface 61a of the molding resin 60 at predetermined intervals. In the present embodiment, when the main current lead frames 41 to 47 are not particularly distinguished from each other, these main current lead frames 41 to 47 will collectively be referred to as the main current lead frames 40. The same applied to the control lead frames 30.

The semiconductor device 10 also includes an attachment hole 60a on each of the short side surfaces 61b and 61d of the molding resin 60. For example, an attachment hole 60a may be formed approximately in the center of each of the short side surfaces 61b and 61d. The locations of the attachment holes 60a in FIGS. 1A and 1B are only examples, and the attachment holes 60a may be formed in different locations. The individual attachment hole 60a has a diameter such that a bolt (not illustrated) is to be inserted into the individual attachment hole 60a. These attachment holes 60a pass through the molding resin 60 from a front surface to the rear surface thereof. The attachment holes 60a are formed outside the insulating sheet 70 in a plan view. By inserting a bolt into the individual attachment hole 60a, a cooling unit may be attached to the semiconductor device 10. The cooling unit is, for example, a heatsink or a cooling device that performs cooling based on refrigerant. In the present embodiment, these attachment holes 60a each have a U-shape in a plan view. Alternatively, the attachment holes 60a may have a circular shape in a plan view. The semiconductor device 10 includes a pair of concave step portions 60e and 60f on the rear surface of the molding resin 60 along the long side surfaces 61a and 61c. For example, the step portions 60e and 60f are formed on sides outside main die pad portions (second main die pad portions) 44a to 46a and main die pad portion (first main die pad portion) 47a and control die pad portion (first control die pad portion) 38a1 and control die pad portion (second control die pad portion) 38a2 (formed along the long side surfaces 61a and 61c) (see FIG. 4, for example). In addition, concave portions 60b are formed on the front surface of the molding resin 60. In FIG. 1B, four concave portions 60b are formed. For example, these concave portions 60b are formed at locations corresponding to four corners of the insulating sheet 70 illustrated in FIG. 3.

In addition, as illustrated in FIG. 2, the semiconductor device 10 has injection cut-off surfaces 60c at three location among the main current lead frames 44 to 47 on the long side surface 61a in the lengthwise direction of the molding resin 60. That is, the injection cut-off surfaces 60c are formed on the long side surface 61a near the short side surface 61d. Assuming that the long side surface 61a is divided into the right and left sides, the right side being near the short side surface 61d, the injection cut-off surfaces 60c are formed on the right side. In addition, an individual injection cut-off surface 60c is formed between two neighboring main current lead frames 40. The injection cut-off surfaces 60c and the main current lead frames 40 are arranged in a line in the lengthwise direction on the long side surface 61a. As will be described below, the locations where the injection cut-off surfaces 60c are formed correspond to the locations of the inlets of a mold into which liquid molding resin raw material is injected. The injection cut-off surfaces 60c are marks that are formed after the molding resin raw material injected into the mold is solidified and the solidified molding resin extending from the inlets to the outside is cut off. Thus, the cross section of the individual injection cut-off surface 60c corresponds to the shape of its corresponding inlet. In addition, the surfaces of the injection cut-off surfaces 60c are coarser than those of the other portions on the long side surface 61a. In addition, the injection cut-off surfaces 60c are more radiant (sparkling) than the other portions on the long side surface 61a. Thus, the injection cut-off surfaces 60c are tactually and visually different from the molding resin 60. For this reason, where the injection cut-off surfaces 60c are formed are easily identifiable on the semiconductor device 10.

In addition, as illustrated in FIG. 1A, the semiconductor device 10 includes a discharge cut-off surface 60d on the short side surface 61b in the breadthwise direction of the molding resin 60 near the long side surface 61c. Assuming that the short side surface 61b is divided into the right and left sides, the left side being near the long side surface 61c, the discharge cut-off surface 60d may be formed on the left side. In addition, if an attachment hole 60a is formed approximately in the center of the short side surface 61b, the discharge cut-off surface 60d may be formed between the attachment hole 60a and the long side surface 61c. As will be described below, the location where the discharge cut-off surface 60d is formed corresponds to the location of an outlet used to discharge excessive molding resin raw material, which has been injected to the mold, from the mold. The discharge cut-off surface 60d is a mark that is formed after the molding resin raw material injected into the mold is solidified and the solidified molding resin extending from the outlet to the outside is cut off, as in the case with the injection cut-off surfaces 60c. The cross section of the discharge cut-off surface 60d also corresponds to the shape of the outlet. The surface of the discharge cut-off surface 60d is coarser than that of the other portion on the short side surface 61b. The discharge cut-off surface 60d is more radiant than the other portion on the short side surface 61b. Thus, the location where the discharge cut-off surface 60d is formed is also tactually and visually different from the molding resin 60, as is the case with the injection cut-off surfaces 60c. Thus, the discharge cut-off surface 60d is easily identifiable on the semiconductor device 10.

In the case of this semiconductor device 10, components as illustrated in FIGS. 3 and 4 are sealed by the molding resin 60. That is, the semiconductor device 10 includes three semiconductor chips (first semiconductor chips) 21, semiconductor chips (second semiconductor chips) 22 to 24, the control lead frames 30 (including control lead frames (first control lead frames) 31 to 37 and control lead frame (first control lead frame) 38), the main current lead frames 40 (including the main current lead frames (second main current lead frames) 41 to 46 and the main current lead frame (first main current lead frame) 47), control IC (first control element) 50h and control IC (second control element) 50l, electronic components 51a to 51c, and the insulating sheet 70. In addition, four areas are set on the molding resin 60 of the semiconductor device 10 in a plan view. That is, a bottom right area HM, a bottom left area LM neighboring the area HM in the direction of the short side surface 61b, a top right area HC neighboring the area HM in the direction of the long side surface 61c, and a top left area LC neighboring the area HC in the direction of the short side surface 61b are set on the molding resin 60 in FIG. 3. The areas HM and HC are in a high side area of the semiconductor device 10. The high side area is a wiring area of an upper arm included in a circuit configuration of the semiconductor device 10. The voltage range in the high side area is, for example, between 400 V and 700 V, inclusive. The areas LM and LC are in a low side area of the semiconductor device 10. The low side area is a wiring area of a lower arm included in the circuit configuration of the semiconductor device 10. The voltage range in the low side area is lower than the voltage range of the high side area, and is, for example, between 15 V and 25 V, inclusive.

Each of the above components of the semiconductor device 10 is formed in a corresponding one of the above areas. The three semiconductor chips 21 constituting the upper arm are disposed in the area HM. The semiconductor chips 22 to 24 constituting the lower arm are disposed in the area LM. The control IC 50h and the electronic components 51a to 51c are disposed in the area HC. The control IC 50h is a high voltage integrated circuit (HVIC). The control IC 50l is disposed in the area LC. The control IC 50l is a low voltage integrated circuit (LVIC). The electronic components 51a to 51c are passive elements, such as thermistors, capacitors, or resistors.

The control IC 50h is electrically and mechanically connected to the three semiconductor chips 21 via control wires (first control wires) 22b. The control IC 50h is electrically and mechanically connected to the electronic components 51a to 51c and control lead frames 30 via control wires 22a. In the present embodiment, two control wires 22b are used to connect the control IC 50h and a single semiconductor chip 21. One of the two control wires 22b is for a gate electrode of this semiconductor chip 21 constituting the upper arm, and the other control wire 22b is for detection of an emitter of the semiconductor chip 21 constituting the upper arm. In the area HM, the three semiconductor chips 21 are connected in parallel to each other. A gate signal is applied from the control wire 22b connected to the gate electrode of the semiconductor chip 21. This gate signal uses the potential of the control wire 22b connected to a main electrode (an emitter electrode) on the front surface of the semiconductor chip 21 as a reference. That is, the control wire 22b has the same potential as the midpoint potential between a power device of the upper arm and a power device of the lower arm. Thus, at the time of switching of a semiconductor chip 21 in the upper arm, a voltage between 400 V and 700 V, inclusive, is applied to the control wire 22b. The control IC 50l is electrically and mechanically connected to the semiconductor chips 22 to 24 via control wires (second control wires) 22c. The control IC 50l is electrically and mechanically connected to control lead frames 30 via control wires 22d. The control wires 22c are for gate electrodes of the semiconductor chips 22 to 24 constituting the lower arm. Thus, a voltage between 15 V and 25 V, inclusive, is applied.

In addition, the three semiconductor chips 21 and the main current lead frames 44 to 46 (main current terminal portions 44c to 46c) are electrically and mechanically connected to each other via main current wires 22e. The semiconductor chips 22 to 24 are electrically and mechanically connected to the main current lead frames 43 to 41, respectively, via main current wires 22e.

In addition, the control wires 22b connect the three semiconductor chips 21 and the control IC 50h. That is, the control wires 22b extend in a direction (a Y direction) perpendicular to the long side surface 61a and the long side surface 61c. The wiring angle of the individual control wire 22b is within ±45° from the direction (the Y direction)

perpendicular to the lengthwise direction parallel to the long side surface 61a. The control wires 22c connect the semiconductor chips 22 to 24 and the control IC 50l. That is, the control wires 22c extend in the direction (the Y direction) perpendicular to the long side surface 61a and the long side surface 61c. The wiring angle of the individual control wire 22b is within ±45° from the direction (the Y direction) perpendicular to the lengthwise direction parallel to the long side surface 61a. While the wiring directions of the individual control wires 22c depend on the locations of their respective wiring target components, it is preferable that the individual control wires 22c extend in the top left direction in FIG. 3 as much as possible. Preferably, the wiring angle of the individual control wire 22c is within ±45° from a line connecting the corner of the long side surface 61a and the short side surface 61d and the corner of the short side surface 61b and the long side surface 61c.

In addition, the distance between two of the plurality of control wires 22b is shorter than the distance between two of the plurality of control wires 22c. In particular, the distance between the midpoint of the bonding points of a control wire 22b connecting a semiconductor chip 21 and the control IC 50h and the midpoint of the bonding points of another control wire 22b connecting another semiconductor chip 21 and the control IC 50h is shorter than the distance between the midpoints of two neighboring control wires 22c. That is, the control wires 22b are closer to each other than the control wires 22c. In FIG. 3, the control wires 22c are illustrated as solid lines and dashed lines. The dashed lines indicate the control wires 22c before the molding resin 60 is injected, and the solid lines indicate the control wires 22c after the molding resin 60 is injected. Thus, the control wires 22c included in the semiconductor device 10 are slanted in the direction of the short side surface 61b. However, since the distance between two neighboring control wires 22c is relatively large, the control wires 22c are slanted without coming into contact with each other. These control wires 22a to 22d and main current wire 22e are made of material having excellent electrical conductivity. Examples of the material include gold, silver, copper, aluminum, and an alloy containing at least one of these kinds. The control wires 22a to 22d each have a diameter, for example, between, 10 μm and 250 μm, inclusive. The main current wires 22e each have a diameter, for example, between 300 μm and 500 μm, inclusive.

The semiconductor chips 21 to 24 are each formed by using silicon, silicon carbide, or gallium nitride as its main component. These semiconductor chips 21 to 24 each include a reverse conducting (RC)-IGBT as a switching element, which is obtained by forming an IGBT and an FWD on a single chip. Each RC-IGBT chip includes a circuit in which an IGBT and an FWD are connected in reverse-parallel to each other. Each of these semiconductor chips 21 to 24 includes an input electrode (a collector electrode) as a main electrode on its rear surface. In addition, each of the semiconductor chips 21 to 24 has a control electrode (a gate electrode) and an output electrode (an emitter electrode) on its front surface. The semiconductor chips 21 to 24 illustrated in FIG. 3 are disposed such that their gate electrodes face the long side surface 61c. The semiconductor chips 21 to 24 each have a thickness, for example, between 50 μm and 220 μm, inclusive. Six pairs of semiconductor chips, each pair being a semiconductor chip including a switching element and a semiconductor chip including a diode element, may be formed in place of these semiconductor chips 21 to 24. In this case, the switching elements of the semiconductor chips are, for example, power MOSFETs or IGBTs. Each of these semiconductor chips includes, for example, a drain electrode (a positive electrode or a collector electrode in the case of an IGBT) as a main electrode on its rear surface and a gate electrode (a control electrode) as a control electrode and a source electrode (a negative electrode or an emitter electrode in the case of an IGBT) as a main electrode on its front surface. The diode elements of the semiconductor chips are SBDs or FWDs such as PiN diodes. Each of these semiconductor chips includes a cathode electrode as a main electrode on its rear surface and an anode electrode as a main electrode on its front surface. In addition, while six semiconductor chips 21 to 24 are arranged in the present embodiment, the number of semiconductor chips is not limited to 6. A different number of pairs of semiconductor chips may be arranged, for example, depending on the specifications of the semiconductor device 10.

Each of the rear surfaces of the semiconductor chips 21 to 24 is bonded to a predetermined one of the main current lead frames 40 via solder (not illustrated). The solder is made of lead-free solder containing a predetermined alloy as its main component. The predetermined alloy is at least one of a tin-silver alloy, a tin-zinc alloy, and a tin-antimony alloy, for example. An additive such as copper, bismuth, indium, nickel, germanium, cobalt, or silicon may be contained in the solder. Instead of soldering, the above bonding may be made by sintering using sintered material. In this case, the sintered material is, for example, silver, gold, or copper powder.

The main electrodes on the front surfaces of the semiconductor chips 21 to 24 are electrically and mechanically connected to their respective main current lead frames 40 via the main current wires 22e. The gate electrodes on the front surfaces of the semiconductor chips 21 are electrically and mechanically connected to the control IC 50h via the control wires 22b. The gate electrodes on the front surfaces of the semiconductor chips 22 to 24 are electrically and mechanically connected to the control IC 50l via the control wires 22c.

The plurality of main current lead frames 40 are arranged along the long side surface 61a of the semiconductor device 10, and the other end of each of the plurality of main current lead frames 40 extends downward in FIG. 3 from the long side surface 61a of the semiconductor device 10. Among the plurality of main current lead frames 40, the main current lead frame 44 has the main die pad portion 44a, a linkage portion 44b, and the main current terminal portion 44c integrally connected with each other. The same applies to the main current lead frames 45 to 47, that is, their respective portions 45a to 45c, 46a to 46c, and 47a to 47c. In FIG. 4, the main current lead frame 46 or 47 is illustrated. The main current lead frame 47 includes a step. Likewise, the other main current lead frames 44 to 46 include a step. The main die pad portions 44a to 47a are formed at a lower level than the main current terminal portions (second main current terminal portions) 44c to 46c and main current terminal portion (first main current terminal portion) 47c, respectively. The semiconductor chips 21 to 24 are bonded to front surfaces of the main die pad portions 44a to 47a and covered by the sealing resin 60. In addition, the insulating sheet 70 is attached to rear surfaces of the main die pad portions 44a to 47a. The main die pad portions 44a to 47a may extend in parallel with the front surface and the rear surface of the molding resin 60. Each of the main die pad portions 44a to 47a is integrally connected to one end of a corresponding one of the linkage portions 44b to 47b. One end of each of the main current terminal portions 44c to 47c is surrounded by the molding resin 60 and is connected integrally with the other end of a corresponding one of the linkage portions 44b to 47b. The other end of each of the main current terminal portions 44c to 47c extends from the long side surface 61a of the molding resin 60 to the outside. The main current terminal portions 44c to 47c may extend in parallel with the front surface and the rear surface of the molding resin 60. The main current terminal portions 44c to 47c are separated from the main die pad portions 44a to 47a in the direction of the long side surface 61a and are separated from the locations where the main die pad portions 44a to 47a are disposed (from the bottom surface of the molding resin 60) in the direction of the front surface of the molding resin 60 by a predetermined height. That is, the main die pad portions 44a to 47a have a different height from that of the main current terminal portions 44c to 47c, and the linkage portions 44b to 47b connect the main die pad portions 44a to 47a and the main current terminal portions 44c to 47c, respectively. Thus, the main current lead frames 44 to 47 extend from their respective locations having a predetermined height on the long side surface 61a in the direction of the inner rear surface of the molding resin 60 and are slanted with respect to the front surface and the rear surface of the molding resin 60. Thus, the main current lead frames 44 to 47 include a step between the main die pad portions 44a to 47a and the main current terminal portions 44c to 47c, respectively. The linkage portions 44b to 47b are sealed by the molding resin 60. The main current terminal portions 44c to 46c are partially sealed by the molding resin 60, and the sealed portions are connected to the main current wires 22e connected to their respective semiconductor chips 21. The main current terminal portions 44c to 47c may extend from the long side surface 61a of the molding resin 60 and bend on the way to extend in parallel with the long side surface 61a. The main current lead frames 41 to 43 are also located at the same height as that of the main current terminal portions 44c to 47c, and the other end of each of the main current lead frames 41 to 43 extends from the long side surface 61a of the molding resin 60 to the outside. The main current lead frames 41 to 43 may extend from the long side surface 61a of the molding resin 60 and bend on the way to extend in parallel with the long side surface 61a. The main current lead frames 41 to 43 are partially sealed by the molding resin 60, and the sealed portions are connected to the main current wires 22e connected to their respective semiconductor chips 24 to 22.

The plurality of control lead frames 30 (including the control lead frames 31 to 38) are formed on the long side surface 61c opposite to the long side surface 61a of the molding resin 60 from which the main current lead frames 44 to 47 extend. The plurality of control lead frames 30 may be formed without a step inside the molding resin 60 and extend in parallel with the front surface and the rear surface of the molding resin 60. The plurality of control lead frames 30 are located at the same height as that of the main current terminal portions 44c to 47c of the main current lead frames 44 to 47. Thus, the plurality of control lead frames 30 are located at a higher level than the main die pad portions 44a to 47a of the main current lead frames 44 to 47. One end of each of the control lead frames 30 extends from the long side surface 61c of the semiconductor device 10 to the outside. Among the plurality of control lead frames 30, the control lead frame 31 includes a control die pad portion 31a and a control terminal (first control terminal portion) 31b. Likewise, the control lead frame 33 includes a control die pad portion 33a and a control terminal (first control terminal portion) 33b. Likewise, the control lead frame 35 includes a control die pad portion 35a and a control terminal (first control terminal portion) 35b. The control die pad portions 31a, 33a, and 35a are bonded to the electronic components 51a, 51b, and 51c, respectively, via solder. The control terminals 31b, 33b, and 35b are connected integrally with the control die pad portions 31a, 33a, and 35a, respectively. The control terminals 31b, 33b, and 35b extend upward in FIG. 3 from the long side surface 61c. In addition, a control lead frame 38 also includes the control die pad portion (first control die pad portion) 38a1 and the control die pad portion (second control die pad portion) 38a2 and a control terminal (first control terminal portion) 38b. The control terminal 38b extends from the long side surface 61c of the molding resin 60 in the direction of the center of the molding resin 60 and bends in the direction of the short side surface 61b to extend in parallel to the long side surface 61c. The control terminal 38b bends again to extend from the long side surface 61c to the outside. The control die pad portions 38a1 and 38a2 are included in the areas HC and LC, respectively. The control ICs 50h and 50l are bonded to the control die pad portions 38a1 and 38a2, respectively, via solder.

The semiconductor chips 21 are electrically and mechanically connected to the control IC 50h via the control wires 22b. As described above, the control die pad portion 38a1 on which the control IC 50h is disposed is at a higher level than the main die pad portions 44a to 47a on which the semiconductor chips 21 to 24 are disposed. Thus, the control wires 22b are connected to a front surface of the control IC 50h and front surfaces of the semiconductor chips 21 lower than the front surface of the control IC 50h. Likewise, the semiconductor chips 22 to 24 are electrically and mechanically connected to the control IC 50l via the control wires 22c. The control wires 22c are also connected to a front surface of the control IC 50l and front surfaces of the semiconductor chips 22 to 24 lower than the front surface of the control IC 50l, as is the case with the control wires 22b. Thus, the control wires 22b and 22c form a high loop and are long. In addition, the control wires 22b and 22c first extend upward (in a +Z direction) from the bonding locations on the control ICs 50h and 50l and next curve and extend downward (in a −Z direction). Thus, the control wires 22b and 22c easily come into contact with end portions of the control ICs 50h and 50l or the control lead frame 30 on which the control ICs 50h and 50l are disposed, the end portions and the control lead frame 30 being located at a higher level than the main die pad portions 44a to 47a.

In addition, the electronic components 51a to 51c are electrically and mechanically connected to the control IC 50h via the control wires 22a. In addition, the control lead frames 32, 34, and 36, etc. are electrically and mechanically connected to the control IC 50h via the control wires 22a. The control lead frames 30 are electrically and mechanically connected to the control IC 50l via the control wires 22d.

The plurality of main current lead frames 40 and the plurality of control lead frames 30 are made of material having excellent electrical conductivity. Examples of the material include copper, aluminum, and an alloy containing at least one of these kinds, for example. The plurality of main current lead frames 40 and the plurality of control lead frames 30 have a thickness, preferably, between 0.10 mm and 1.00 mm, inclusive, more preferably, between 0.20 mm and 0.50 mm, inclusive. In addition, the plurality of main current lead frames 40 and the plurality of control lead frames 30 may be plated with material having excellent corrosion resistance. Examples of this material include nickel, gold, and an alloy containing at least one of these kinds, for example.

The molding resin 60 contains thermosetting resin and inorganic filler contained therein. For example, the thermosetting resin contains as its main component at least one kind selected from a group including epoxy resin, phenol resin, and melamine resin. Preferably, the thermosetting resin contains epoxy resin as its main component. In addition, inorganic material having a high insulating property and high thermal conductivity is used as the inorganic filler. For example, the inorganic material contains, as its main component, at least one kind selected from a group including aluminum oxide, aluminum nitride, silicon nitride, and boron nitride. Preferably, the inorganic filler contains silicon oxide as its main component. By using silicon oxide, the inorganic filler serves as mold release agent as well. In addition, a high flame retardance is maintained without blending halogen-based, antimony-based, or metal hydroxide-based flame retardant, for example. The inorganic filler is between 70 vol % and 90 vol %, inclusive, of the sealing raw material.

The insulating sheet 70 also contains thermosetting resin and inorganic filler contained therein. For example, the thermosetting resin contains as its main component at least one kind selected from a group including epoxy resin, phenol resin, melamine resin, and polyimide resin. Preferably, the thermosetting resin contains epoxy resin as its main component. In addition, inorganic material containing as its main component at least one kind selected from a group including aluminum oxide, aluminum nitride, silicon nitride, and boron nitride having a high insulating property and high thermal conductivity is used as the filler. In addition, it is preferable that the molding resin 60 and the insulating sheet 70 contain the same thermosetting resin as their main component. More preferably, the thermosetting resin of the molding resin 60 and the thermosetting resin of the insulating sheet 70 contain epoxy resin as their main component.

The insulating sheet 70 has a rectangular shape in a plan view, for example. The insulating sheet 70 has a thickness between 50 μm and 1.2 mm, inclusive. On a front surface of the insulating sheet 70, the main die pad portions 44a to 47a of the plurality of main current lead frames 44 to 47 are arranged in a line in a lengthwise direction of the insulating sheet 70. The insulating sheet 70 has a size such that at least the plurality of main die pad portions 44a to 47a are disposed. Thus, the insulating sheet 70 may have a larger size than that illustrated in FIG. 3. By covering the main die pad portions 44a to 47a, even if the semiconductor device 10 deforms, the insulating property is maintained more firmly.

In addition, as described above, the rear surface of the insulating sheet 70 is exposed to the outside from the rear surface of the molding resin 60 and is on the same plane with the rear surface of the molding resin 60. Since the insulating sheet 70 covers the rear surfaces of the main die pad portions 44a to 47a as described above, the insulating property between the main die pad portions 44a to 47a and the outside is maintained. In addition, the insulating sheet 70 releases the heat generated by the semiconductor chips 21 to 24 and transferred by the main die pad portions 44a to 47a to the outside of the semiconductor device 10. That is, the insulating sheet 70 contributes to the heat dissipation of the semiconductor device 10.

Figure 5:
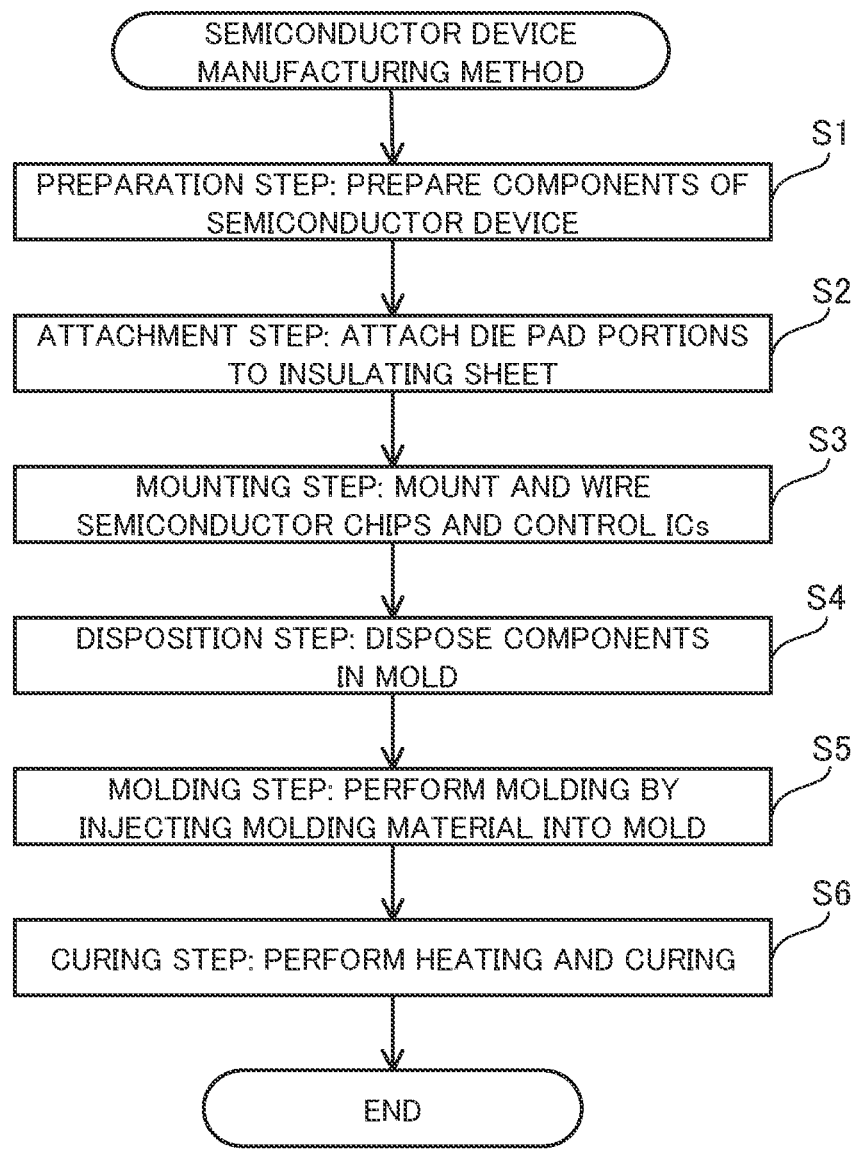
FIG. 5 is a flowchart illustrating a manufacturing method of the semiconductor device according to the embodiment.
Figure 6:
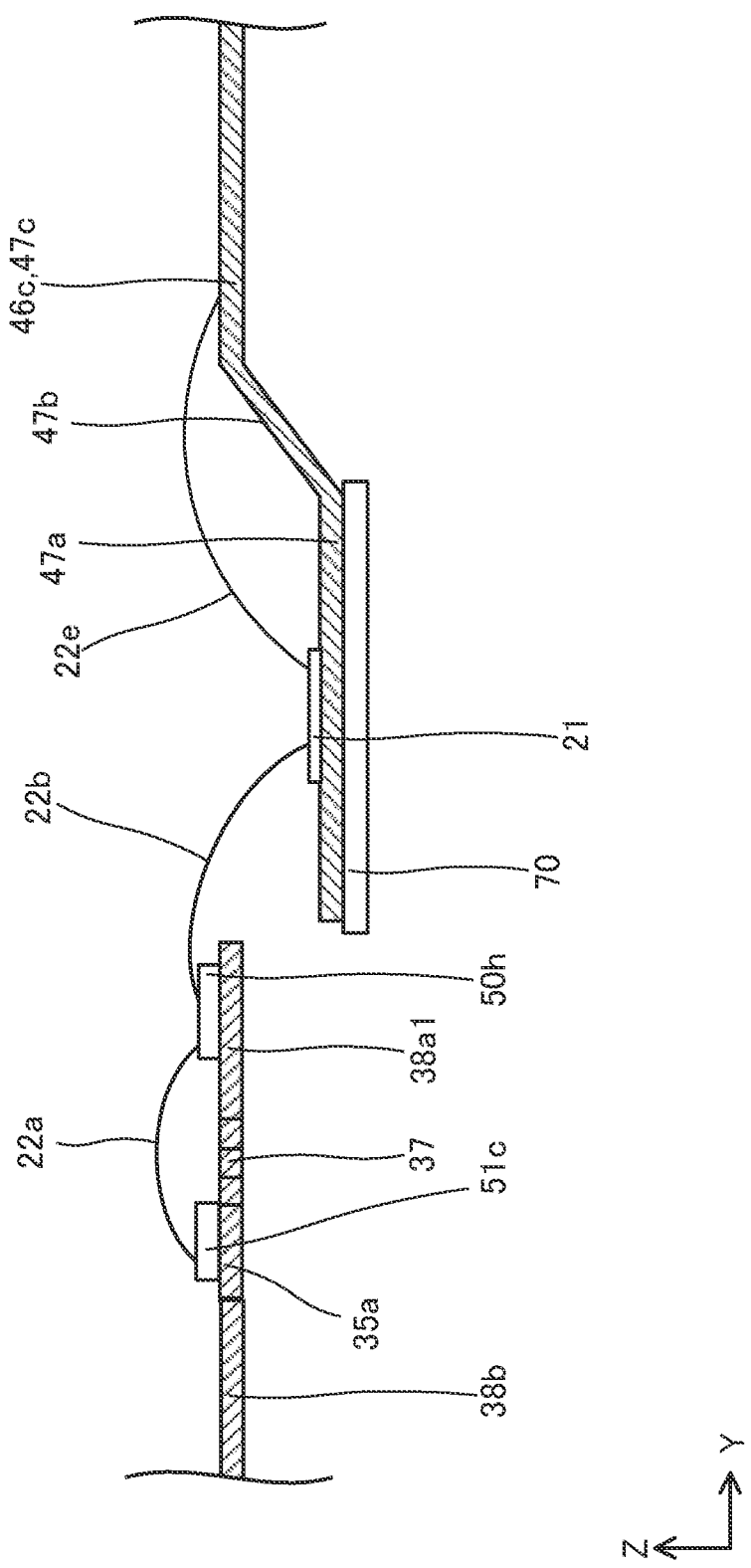
FIG. 6 illustrates a mounting step included in the manufacturing method of the semiconductor device according to the embodiment.
Figure 7:
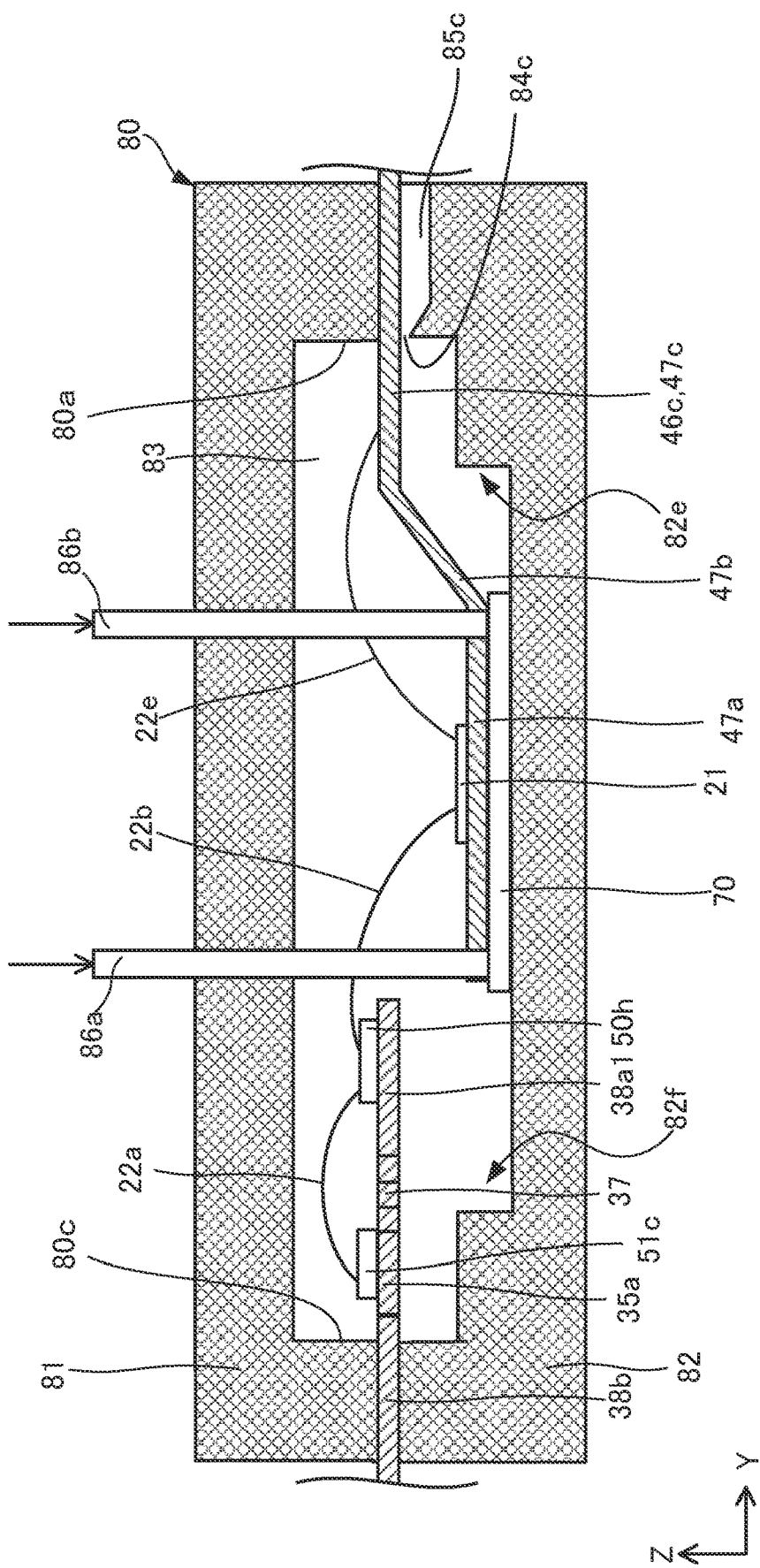
FIG. 7 is a sectional view illustrating a disposition step included in the manufacturing method of the semiconductor device according to the embodiment.
Figure 8:
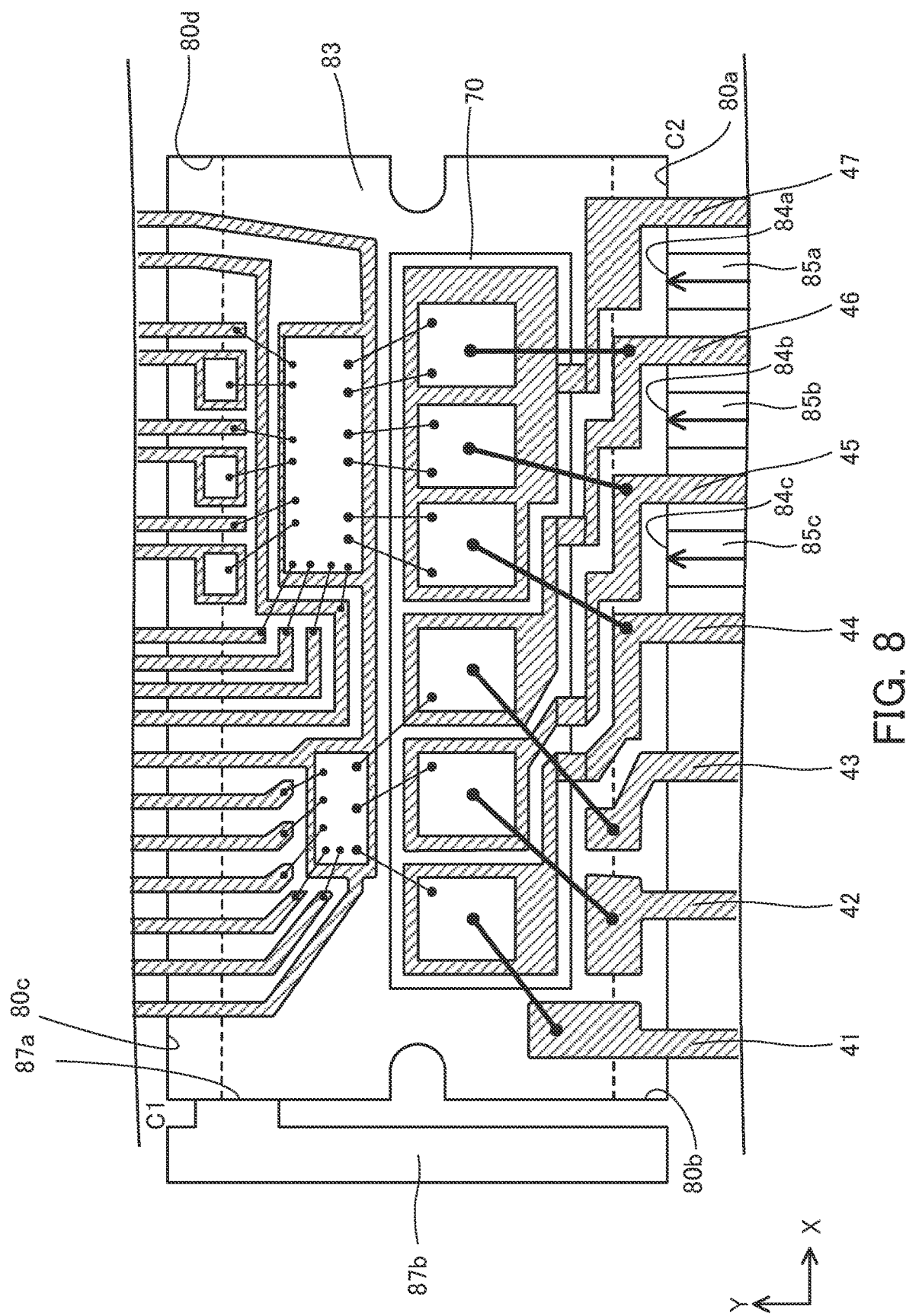
FIG. 8 is a plan view illustrating the disposition step included in the manufacturing method of the semiconductor device according to the embodiment.

Next, a manufacturing method of the semiconductor device 10 will be described with reference to FIGS. 5 to 8. FIG. 5 is a flowchart illustrating a manufacturing method of the semiconductor device 10 according to the embodiment. FIG. 6 illustrates a mounting step included in the manufacturing method of the semiconductor device 10 according to the embodiment. FIG. 7 is a sectional view illustrating a disposition step included in the manufacturing method of the semiconductor device 10 according to the embodiment. FIG. 8 is a plan view illustrating the disposition step included in the manufacturing method of the semiconductor device 10 according to the embodiment. FIGS. 6 and 7 are each a sectional view corresponding to the location of the cross section taken along the dashed-dotted line X-X in FIG. 3, as is the case with FIG. 4. FIG. 8 illustrates the inside of a cavity 83 of a mold 80 in a plan view. The following description will be made by using the location of the cross section illustrated in FIG. 4 as an example.

The first step is a preparation step of preparing components of the semiconductor device 10 (step S1 in FIG. 5). The components of the semiconductor device 10 are the semiconductor chips 21 to 24, the main current lead frames 40, the control lead frames 30, a semi-hard insulating sheet 70, molding resin raw material 62, etc.

The main current lead frames 40 and the control lead frames 30 may be prepared as a metal plate having integrated wiring patterns such as a tie bar. For example, etching or punching is performed on a single metal plate to form the portions corresponding to the main current lead frames 40 and the control lead frames 30. In addition, pressing using a predetermined mold is performed to form steps. In this way, a metal plate having a wiring pattern in which the portions corresponding to the main current lead frames 40 and the portions corresponding to the control lead frames 30 are integrated with a tie bar is obtained.

The insulating sheet 70 is a sheet containing semi-hard (stage B) thermosetting resin and inorganic filler. For example, the insulating sheet 70 is manufactured as follows. First, liquid resin (stage A), which is thermosetting resin, and inorganic filler, which is to be mixed with the liquid resin, are prepared. The resin used herein contains, as its main component, at least one kind selected from a group including epoxy resin, phenol resin, melamine resin, and polyimide resin. Preferably, the resin contains epoxy resin as its main component. For example, inorganic material containing, as its main component, at least one kind selected from a group including aluminum oxide, aluminum nitride, silicon nitride, and boron nitride is used as the inorganic filler. Next, the liquid (stage A) thermosetting resin and the inorganic filler are mixed, and coating is performed such that the resultant material is shaped in a sheet. Next, the sheet material is heated until it reaches a semi-hard state (stage B). In this way, the insulating sheet 70 is manufactured. Alternatively, the insulating sheet 70 may be manufactured by heating the liquid (stage A) thermosetting resin mixed with inorganic filler first until it reaches a semi-hard state (stage B) and shaping the semi-hard thermosetting resin in a sheet. The heating and heating time in this case are suitably set based on a takt time and depending on the kind of the catalyst of the resin. For example, the heating temperature is between 100° C. and 200° C., inclusive.

The molding resin raw material 62 is powder or a tablet containing semi-hard (stage B) thermosetting resin and inorganic filler. For example, the molding resin raw material 62 is manufactured as follows. First, liquid resin (stage A), which is thermosetting resin, and inorganic filler, which is to be mixed with the liquid resin, are prepared. The resin used herein contains, as its main component, at least one kind selected from a group including epoxy resin, phenol resin, and melamine resin. Preferably, the resin contains epoxy resin as its main component. In addition, inorganic material containing silicon oxide as its main component is used as the inorganic filler. Next, the inorganic filler is mixed with the liquid resin. By heating the liquid resin (stage A) mixed with the inorganic filler, semi-hard raw material (stage B) is made. The heating and heating time in this case are suitably set based on a takt time and depending on the kind of the catalyst of the resin. For example, the heating temperature is between 100° C. and 200° C., inclusive. The semi-hard raw material is made into powder, and this powder is made into, for example, a tablet. In this way, the molding resin raw material 62 is manufactured.

The next step is an attachment step of attaching the semi-hard insulating sheet to the rear surface of an area corresponding to the main die pad portions 44a to 47a of the main current lead frames 44 to 47 included in the metal plate (step S2 in FIG. 5). In this step, the semi-hard insulating sheet may be attached to the above rear surface by pressing by a pressing apparatus. A pressing machine may be used as the pressing apparatus. By heating the semi-hard insulating sheet 70 and pressing the semi-hard insulating sheet 70 in a softened state, the semi-hard insulating sheet 70 and the above rear surface are tightly attached to each other. Next, the semi-hard insulating sheet 70 is removed from the pressing apparatus. As a result, the main current lead frames 40 and the control lead frames 30 (the metal plate) to which the semi-hard insulating sheet 70 has been tightly attached are consequently formed.

The next step is a mounting step of mounting the semiconductor chips 21 to 24, the control ICs 50h and 50l, and the electronic components 51a to 51c on the main current lead frames 40 and the control lead frames 30 included in the metal plate and wiring these components (step S3 in FIG. 5). In this step, as illustrated in FIG. 6, first, the semiconductor chips 21 to 24 (a semiconductor chip 21 is illustrated in FIG. 6) are soldered to the main die pad portions 44a to 47a (the main die pad portion 47a is illustrated in FIG. 6) of the main current lead frames 44 to (parts of the main current lead frames 47 and 46 are illustrated in FIG. 6). The control ICs 50h and 50l are soldered to the control die pad portions 38a1 and 38a2 of the control lead frame 38, respectively. The electronic components 51a, 51b, and 51c are soldered to the control die pad portions 31a, 33a, and 35a of the control lead frames 31, 33, and 35, respectively. The above bonding may be performed by using sintering using sintered material or resin such as adhesive agent, in place of solder. Next, these are conveyed to a predetermined bonding apparatus that performs wire bonding and are wired. For example, the main current lead frames 40 on which the semiconductor chips 21 to 24 are mounted and the control lead frames 30 on which the control ICs 50h and 50l are mounted are suitably electrically connected to each other by using the main current wires 22e and the control wires 22b and 22c. As described above, the main current lead frames 44 to 47 have steps, and the semiconductor chips 21 to 24 are disposed at a lower level than the control ICs 50h and 50l. Thus, since the loops of the control wires 22b and 22c, which connect the semiconductor chips 21 to 24 and the control ICs 50h and 50l, are larger than those of the control wires 22a and 22d. Thus, the individual control wire 22b is longer than the actual distance between a corresponding semiconductor chip 21 and the control IC 50h. Likewise, the individual control wire 22c is longer than the actual distance between a corresponding one of the semiconductor chips 22 to 24 and the control IC 50l.

Next, for example, as illustrated in FIGS. 7 and 8, a disposition step of disposing the metal plate, on which the semiconductor chips 21 to 24, the control ICs 50h and 50l, and the electronic components 51a to 51c have been mounted and to which the insulating sheet 70 has been attached, in the mold 80 (step S4 in FIG. 5). The metal plate including the main current lead frames 40 and the control lead frames 30 is conveyed into a molding apparatus that performs molding and is disposed in a lower mold 82 of the mold 80. In this step, the semi-hard insulating sheet 70 and the main die pad portions 44a to 47a (the main die pad portion 47a is illustrated in FIG. 7) are disposed in this order on a bottom surface of the lower mold 82. Next, the molding apparatus sandwiches the main current lead frames 40 and the control lead frames 30 between an upper mold 81 and the lower mold 82 of the mold 80. The mold 80 includes the cavity 83. This cavity 83 has a rectangular shape in a plan view and is surrounded by one long side (first long mold side) 80a, one short side (third short mold side) 80b, the other long side (second long mold side) 80c, and the other short side (fourth short mold side) 80d in this order. In addition, the lower mold 82 has mold step portions 82e and 82f along the long sides 80a and 80c between the short sides 80b and 80d. It is preferable that the mold step portions 82e and 82f have a height (depth), for example, approximately the same as or larger than a sum of the thickness of the insulating sheet 70 and the thickness of any one of the main die pad portions 44a to 47a.

In addition, the mold 80 has inlets 84a to 84c, gates 85a to 85c, and an outlet 87a. The inlets 84a to 84c communicate with the cavity 83 and are formed on the long side 80a of the cavity 83 near the short side 80d. Assuming that the long side 80a is divided into the right and left sides, the right side being near the short side 80d, the inlets 84a to 84c are formed on the right side. An individual one of the inlets 84a to 84c is located between two neighboring main current lead frames 40. In addition, the inlets 84a to 84c are arranged in a line along with the plurality of main current lead frames 40. In the case of FIG. 8, an individual one of the inlets 84a to 84c is formed between two of the main current lead frames 44 to 47. That is, when seven main current lead frames 40 are used, the inlets 84a to 84c are formed up to the fourth main current lead frame 40 from the short side surface 61d. As long as these inlets (84a to 84c in FIG. 8) are formed on the long side 80a of the cavity 83 near the short side 80d, a different number or size of inlets may alternatively be formed.

The gates 85a to 85c connect runners, which are formed in a pot containing the molding resin raw material, and the inlets 84a to 84c. The gates 85a to 85c are used to inject the molding resin raw material flowing through the runners into the cavity 83 through the inlets 84a to 84c.

The outlet 87a communicates with the cavity 83 and is formed on the short side 80b of the cavity 83 near the long side 80c. Assuming that the short side 80b is divided into the right and left sides, the left side being near the long side 80c, the outlet 87a is formed on the left side. If an attachment hole 60a is formed approximately in the center of the short side 80b, the outlet 87a is formed between the attachment hole 60a and the long side 80c. As will be described below, the outlet 87a may have any size as long as the molding resin raw material 62 is smoothly discharged. In addition, the outlet 87a communicates with a resin chamber 87b. The resin chamber 87b communicates with the outlet 87a and holds the molding resin raw material 62 that has been discharged from the outlet 87a.

In this way, the plurality of main current lead frames 40 and the plurality of control lead frames 30 are disposed in the cavity 83 covered by the upper mold 81 and the lower mold 82.

In the above manufacturing steps S1 to S4, the mounting step in step S3 may be performed before the attachment step in step S2. Alternatively, the attachment step in step S2 may be performed during the mounting step in step S3. In this case, after the soldering of the semiconductor chips 21 to 24, the control ICs 50*h* and 50*l*, and the electronic components 51*a* to 51*c* in step S3, the attachment step in step S2 may be performed, and the remaining wiring in the mounting step in step S3 may be performed.

In addition, in the above manufacturing steps S1 to S4, after the preparation step in step S1, the mounting step in step S3 may be performed without performing the attachment step in step S2. Next, the semi-hard insulating sheet 70 may be disposed in the lower mold 82, and the semiconductor chips 21 to 24, the control ICs 50*h* and 50*l*, and the electronic components 51*a* to 51*c* may be disposed on the semi-hard insulating sheet 70. Next, the plurality of main current lead frames 40 and the plurality of control lead frames 30 wired may be arranged. Specifically, in the disposition step in step S4, first, the insulating sheet 70 is disposed on the bottom surface of the lower mold 82 such that the rear surface of the insulating sheet 70 comes into contact with the bottom surface of the lower mold 82. Next, the main die pad portions are disposed on the front surface of the insulating sheet 70 such that the rear surfaces of the main die pad portions come into contact with the front surface of the insulating sheet 70. In this way, the attachment step in step S2 is simultaneously performed in the disposition step in step S4.

The next step is a molding step of injecting the liquid molding resin raw material 62 into the mold 80 and performing molding (step S5 in FIG. 5). First, as illustrated in FIG. 7, the semi-hard insulating sheet 70 is pressed in the direction of the bottom surface of the lower mold 82 by using a plurality of pressing portions (pressing portions 86*a* and 86*b* in FIG. 7), and this state is maintained. The upper mold 81 of the mold 80 is provided with the plurality of pressing portions (the pressing portions 86*a* and 86*b* in FIG. 7) that are movable vertically in FIG. 7. The pressing portions may perpendicularly press the semi-hard insulating sheet 70 in the direction of a front surface of the lower mold 82. The plurality of pressing portions may each be a cylindrical or prismatic pin. In this way, the insulating sheet 70 is certainly pressed without interrupting the injection of the molding resin raw material. The plurality of pressing portions may each have a different shape, as long as the insulating sheet 70 is certainly pressed without interrupting the injection of the molding resin raw material. In addition, as will be described below, the plurality of pressing portions are each made of material having a high mold release property with respect to the molding resin raw material with which the cavity 83 is filled. Alternatively, such material may be applied to the surface of the individual pressing portion. Preferably, the individual pressing portion includes the same material as that of the upper mold 81.

Next, a tablet semi-hard (stage B) molding resin raw material 62 may be disposed in the pot of the molding apparatus. Next, this molding resin raw material 62 is heated and softened. Pressure is applied to the softened semi-hard molding resin raw material, which is next injected into the cavity 83 from the gates 85*a* to 85*c*. The upper mold 81 and the lower mold 82 are heated in advance, and the cavity 83 is filled with the softened semi-hard molding resin raw material 62.

Next, the injection of the softened semi-hard molding resin raw material 62 into the cavity 83 will be described in detail with reference to FIGS. 9 to 13. FIGS. 9 to 13 are each a plan view illustrating a molding step included in the manufacturing method of the semiconductor device 10 according to the embodiment. FIGS. 9 to 13 are each a plan view of the inside of the cavity 83 of the mold 80. Hereinafter, a corner portion formed by the long side 80*c* and the short side 80*b* of the cavity 83 (a corner portion in the −X direction and +Y direction) will be referred to as a corner C1. A corner portion formed by the long side 80*a* and the short side 80*d* (a corner portion in the +X direction and −Y direction) will be referred to as a corner C2. That is, these corners C1 and C2 are located diagonally inside the cavity 83.

Figure 9:
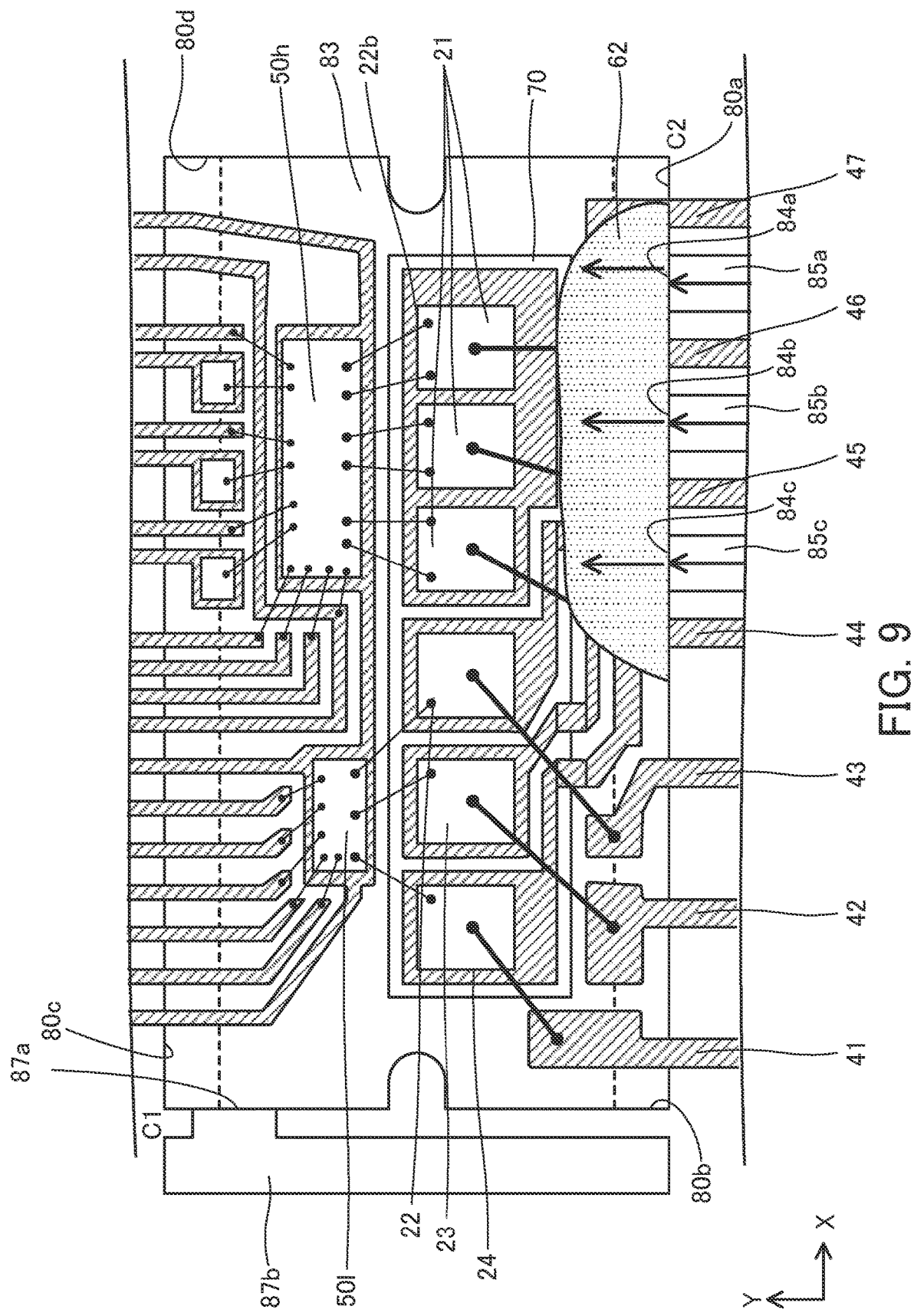
FIG. 9 is a first plan view illustrating a molding step included in the manufacturing method of the semiconductor device according to the embodiment.

When the molding resin raw material 62 inside the pot is pressed, the molding resin raw material 62 flows out of the runners communicating with the pot and flows into the gates 85*a* to 85*c*. The semi-hard molding resin raw material flowing into the gates 85*a* to 85*c* is injected almost simultaneously into the cavity 83 from the three inlets 84*a* to 84*c*, as illustrated in FIG. 9. The molding resin raw material 62 is injected perpendicularly (in the +Y direction) with respect to the long side 80*a* from the three inlets 84*a* to 84*c*. In addition, certain amounts of molding resin raw material 62 are injected from the individual inlets 84*a* to 84*c* almost simultaneously per unit time. Thus, in a plan view, the molding resin raw material 62 spreads inside the cavity 83 from the three inlets 84*a* to 84*c* in the same way up to the insulating sheet 70 on which the main die pad portions 44*a* to 47*a* are disposed.

Figure 10:
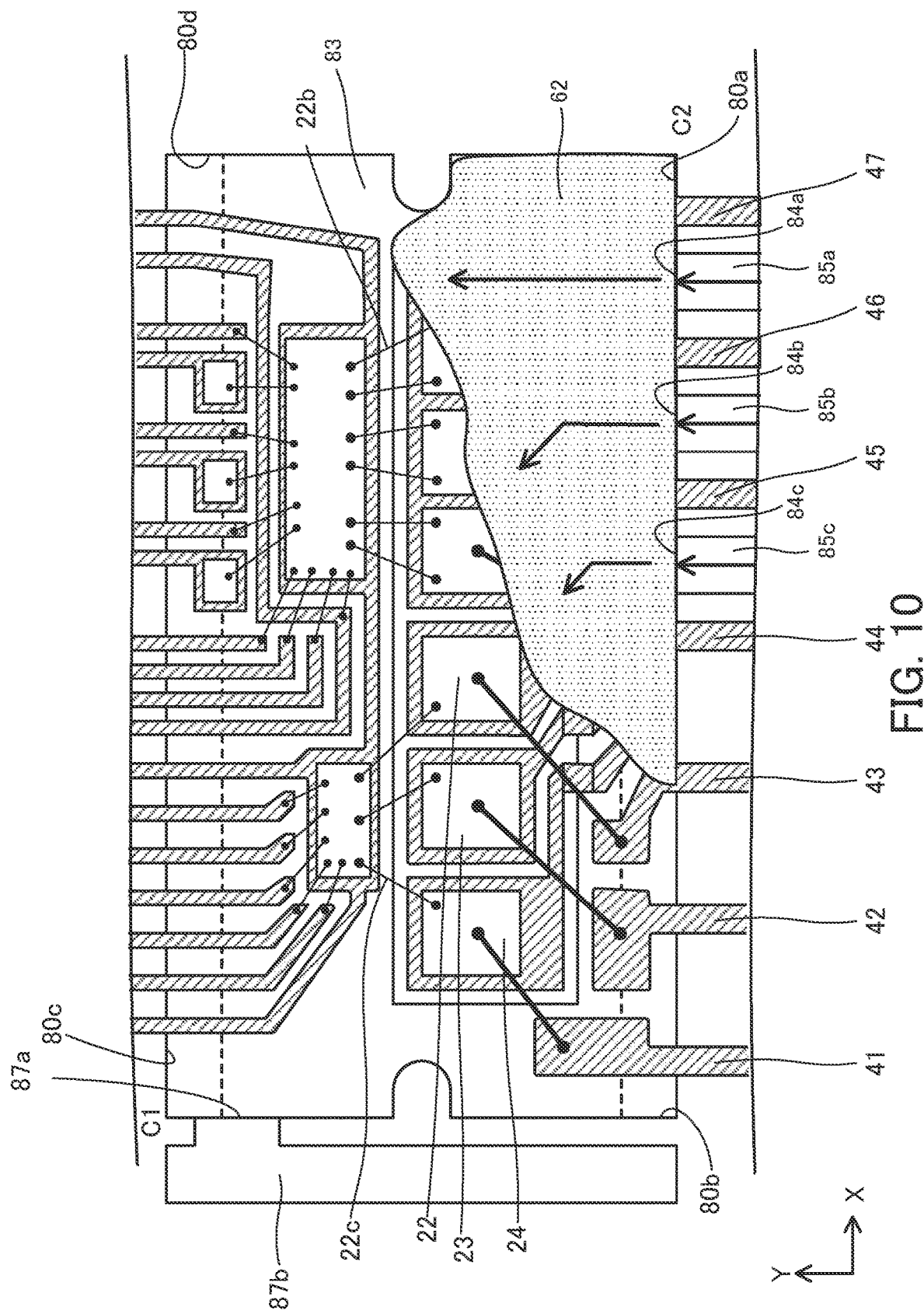
FIG. 10 is a second plan view illustrating the molding step included in the manufacturing method of the semiconductor device according to the embodiment.

As described above, the main current lead frames 44 to 47 include a step due to the linkage portions 44*b* to 47*b*, respectively. The flow of the molding resin raw material 62 injected from the three inlets 84*a* to 84*c* is interrupted by the linkage portions 44*b* to 47*b* of the main current lead frames 44 to 47. In addition, since the cavity 83 deepens (the length in the Z direction increases) because of the mold step portions 82*e* and 82*f*, the speed of the flow of the molding resin raw material 62 decreases. Thus, as illustrated in FIG. 10, at the linkage portions 44*b* to 47*b*, the molding resin raw material 62 begins to flow in the direction of the corner C1. In particular, at the linkage portions 44*b* to 46*b* located on the inner area of the long side 80*a*, the molding resin raw material 62 begins to spread in the direction from the corner C2 to the corner C1. Near the short side 80*d* where the linkage portions 44*b* to 47*b* are absent, the molding resin raw material 62 flows straight in the direction of the long side 80*c*.

Figure 11:
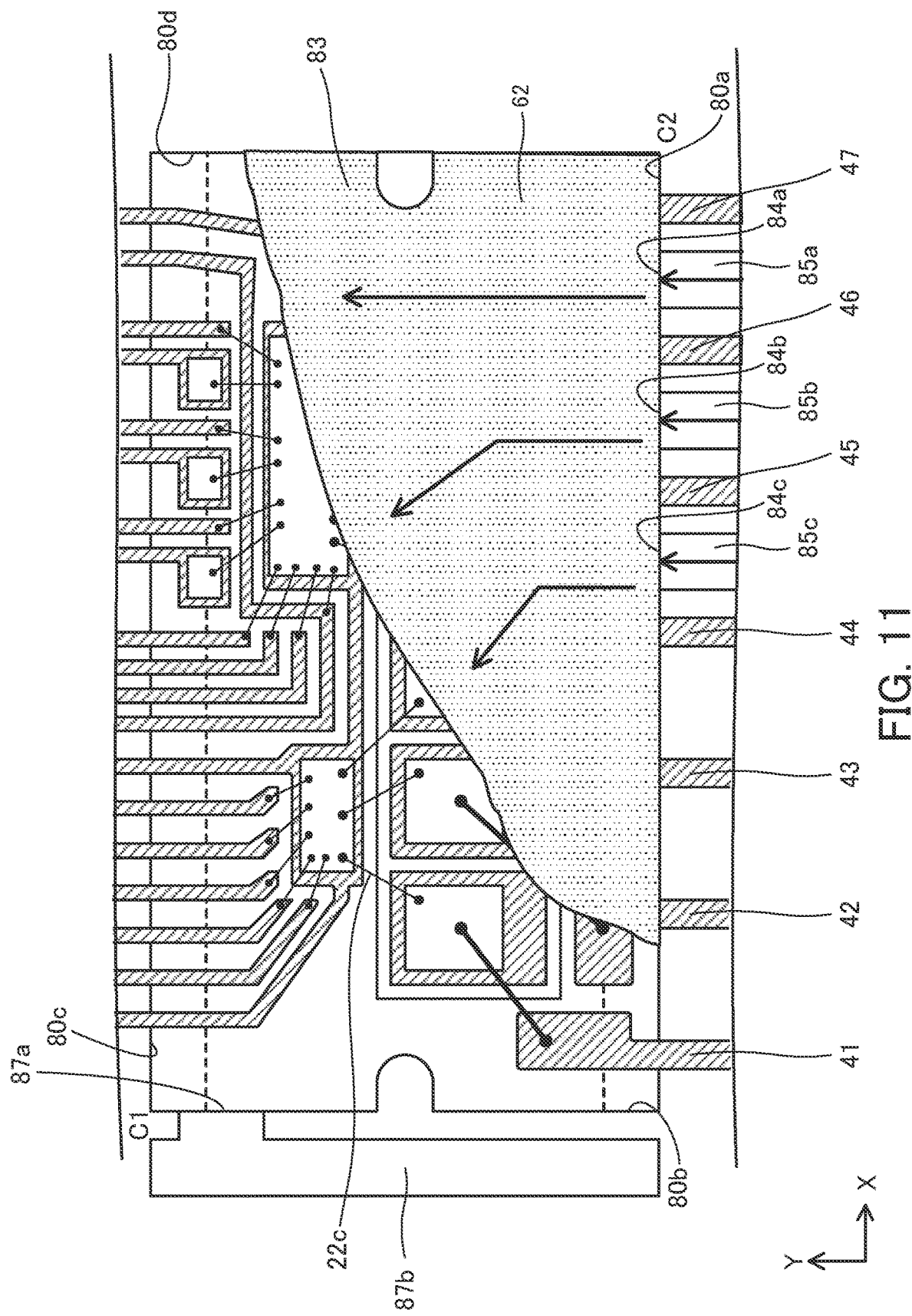
FIG. 11 is a third plan view illustrating the molding step included in the manufacturing method of the semiconductor device according to the embodiment.

The molding resin raw material 62 spreading inside the cavity 83 flows in the direction from the long side 80*a* to the long side 80*c*, as illustrated in FIGS. 10 and 11. More specifically, around the control wires 22*b*, the molding resin raw material 62 along the short side 80*d* flows in the direction (in the +Y direction) perpendicular to the long side 80*a*, and the molding resin raw material 62 along the center portion flows in the direction from the corner C2 to the corner C1. That is, the molding resin raw material 62 flowing perpendicularly to the long side 80*a* (in the +Y direction) changes its flowing direction and begins to flow in the direction from the corner C2 to the corner C1. As described above, since the control wires 22*b* include those for sense emitters in the high side area, many control wires 22*b* are used. Since many control wires 22*b* are used in the limited area, the distance between control wires 22*b* is short. In addition, since the semiconductor chips 21 each have a different height from that of the control IC 50*h*, the control wires 22*b* have high loops and are long. Thus, if the control wires 22*b* are slanted even a little, the control wires 22*b* easily come into contact with each other. However, the molding resin raw material 62 covers the control wires 22*b* while flowing in the same direction as the direction from the long side 80*a* to the long side 80*c*, which is the wiring direction of the control wires 22b. Thus, since the control wires 22b are little affected by the flow resistance of the molding resin raw material 62, the slanting of the control wires 22b at the portions where the semiconductor chips 21 and the control IC 50h are connected is reduced.

Next, the forefront of the molding resin raw material 62 generally proceeds in the direction from the corner C2 to the corner C1. As described above, the control wires 22c in the low side area are formed to extend in the top left direction in FIG. 12 as much as possible. This wiring direction of the control wires 22c is the same direction as the traveling direction of the molding resin raw material 62 flowing in the direction of the outlet 87a. Thus, since the control wires 22c are little affected by the flow resistance of the molding resin raw material 62, the slanting of the control wires 22c at the portions where the semiconductor chips 22 and 23 and the control IC 50l are connected is prevented or reduced.

However, the control wire 22c connecting the semiconductor chip 24 and the control IC 50l extends in the top right direction of the cavity 83. Thus, since the control wire 22c is affected by the flow resistance of the molding resin raw material 62, the control wire 22c could be slanted. However, since the control wires 22c in the low side area are widely separated from each other, even if the control wires 22c are slanted, the control wires 22c rarely come into contact with each other. In addition, the control wires 22c are farther away from the inlets 84a to 84c than the control wires 22b. The molding resin raw material 62 reaches the control wires 22c while spreading inside the whole cavity 83. Thus, at the time the molding resin raw material 62 reaches the control wires 22c, the speed of the flow is less than that at the control wires 22b. Thus, the slanting of the control wires 22c in the top right direction of the cavity 83 is less than that of the control wires 22b. In addition, since the main current wires 22e have a larger diameter than that of the control wires 22a to 22d, the main current wires 22e are bonded to their respective target components more tightly. Thus, even if the main current wires 22e receive the flow resistance of the molding resin raw material 62, the main current wires 22e are rarely slanted or peeled off.

Figure 12:
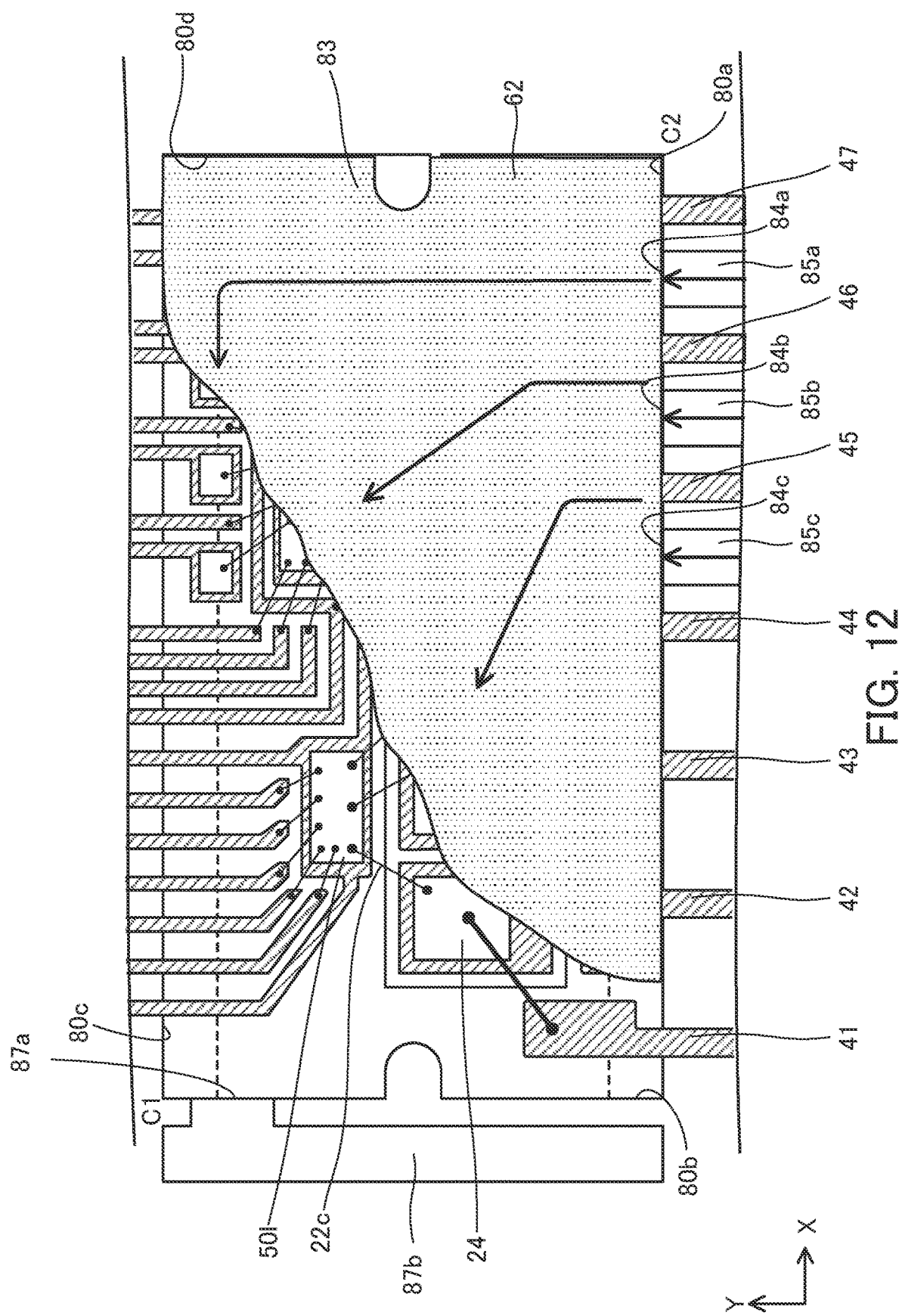
FIG. 12 is a fourth plan view illustrating the molding step included in the manufacturing method of the semiconductor device according to the embodiment.

Next, the forefront of the molding resin raw material 62 continues to proceed in the direction from the corner C2 to the corner C1. When a portion of the molding resin raw material 62, the portion being near the short side 80d, reaches the long side 80c, the portion begins to flow in the direction of the short side 80b as illustrated in FIG. 12. When the forefront of the molding resin raw material 62 continues to proceed in the direction from the corner C2 to the corner C1 and when a portion of the molding resin raw material 62, the portion being near the long side 80a, reaches the short side 80b, the portion beings to flow in the direction of the long side 80c. The forefront of the molding resin raw material 62 pushes the air inside the cavity 83 to the corner C1 and discharges the air from the outlet 87a. As a result, the molding resin raw material 62 fills the cavity 83 while being discharged into the outlet 87a along with the air (see FIG. 13).

If the inlets 84a to 84c were formed away from the corner C2 on the long side 80a of the cavity 83, for example, if the inlets 84a to 84c were formed in the center of the long side 80a, the molding resin raw material 62 would spread in the direction of the corner C1 and a corner of the short side 80d opposite to the corner C1. In this case, the air inside the cavity 83 would not be pushed into a single location. Thus, it is preferable that the inlets 84a to 84c be formed near the corner C2 on the long side 80a of the cavity 83 so that the forefront of the molding resin raw material 62 will proceed in the direction from the corner C2 to the corner C1.

After the molding resin raw material 62 fills the cavity 83 while discharging the air, the air in the cavity 83, especially in the locations corresponding to the areas HM and HC (see FIG. 3), is removed, and thus, generation of voids is reduced. That is, since the outlet 87a is formed on the short side 80b of the cavity 83 near the long side 80c (near the corner C1), the air inside the cavity 83 pushed by the molding resin raw material 62 is suitably discharged. If the outlet 87a were formed away from the corner C1 on the short side 80b of the cavity 83, the air pushed by the forefront of the molding resin raw material 62 flowing in the direction from the corner C2 to the corner C1 would not be suitably discharged. In this case, voids could remain in the molding resin 60. Thus, it is preferable that the outlet 87a be formed on the short side 80b of the cavity 83 near the long side 80c and the corner C1 as much as possible.

However, for example, in FIG. 12, when two portions of the molding resin raw material 62 flowing inside the cavity 83, one portion being along the short side 80d and the other portion being along the long side 80a, reach the long side 80c and the short side 80b, these portions change their flow directions and begin to flow toward the short side 80b and the long side 80c. After changing their directions, these portions of the molding resin raw material 62 join together around the control IC 50l. Thus, in this area, the flow of the molding resin raw material 62 stagnates. If the flow of the molding resin raw material 62 stagnates, the air is not suitably discharged, and as a result, the air could remain in the molding resin raw material 62. If the molding resin raw material 62 is solidified in this state, voids could remain in the molding resin 60. Thus, the total volume of the voids included in the portions in the areas LM and LC is larger than the total volume of the voids included in the portions in the areas HM and HC (see FIG. 3). However, since the voltage range in the low side area is lower than the voltage range of the high side area, even if some voids are included, for example, an electrical discharge does not occur. Thus, the reliability of the semiconductor device 10 is maintained.

To fill the cavity 83 with the molding resin raw material 62, as described above, the inlets 84a to 84c are formed on the long side 80a of the cavity 83 near the short side 80d, and the outlet 87a is formed on the short side 80b of the cavity 83 near the long side 80c. In addition, in FIGS. 8 to 13, the flow of the left side of the forefront of the molding resin raw material 62 injected into the cavity 83 from the inlets 84a to 84c is interrupted by the linkage portions 44b to 47b of the main current lead frames 44 to 47 and proceeds in the direction of the corner C1. However, the flow of the right side of the forefront proceeds straight without being interrupted. Thus, the molding resin raw material 62 injected from the inlets 84a to 84c fills the cavity 83 while flowing generally from the corner C2 to the corner C1 inside the cavity 83. Thus, the inlets 84a to 84c are formed on the long side 80a of the cavity 83 near the short side 80d. Preferably, the leftmost inlet 84c is formed between the linkage portion 44b and the short side 80d, the middle inlet 84b is formed between the linkage portions 45b and 47b, and the rightmost inlet 84a is formed between the linkage portion 47b and the short side 80d.

Figure 13:
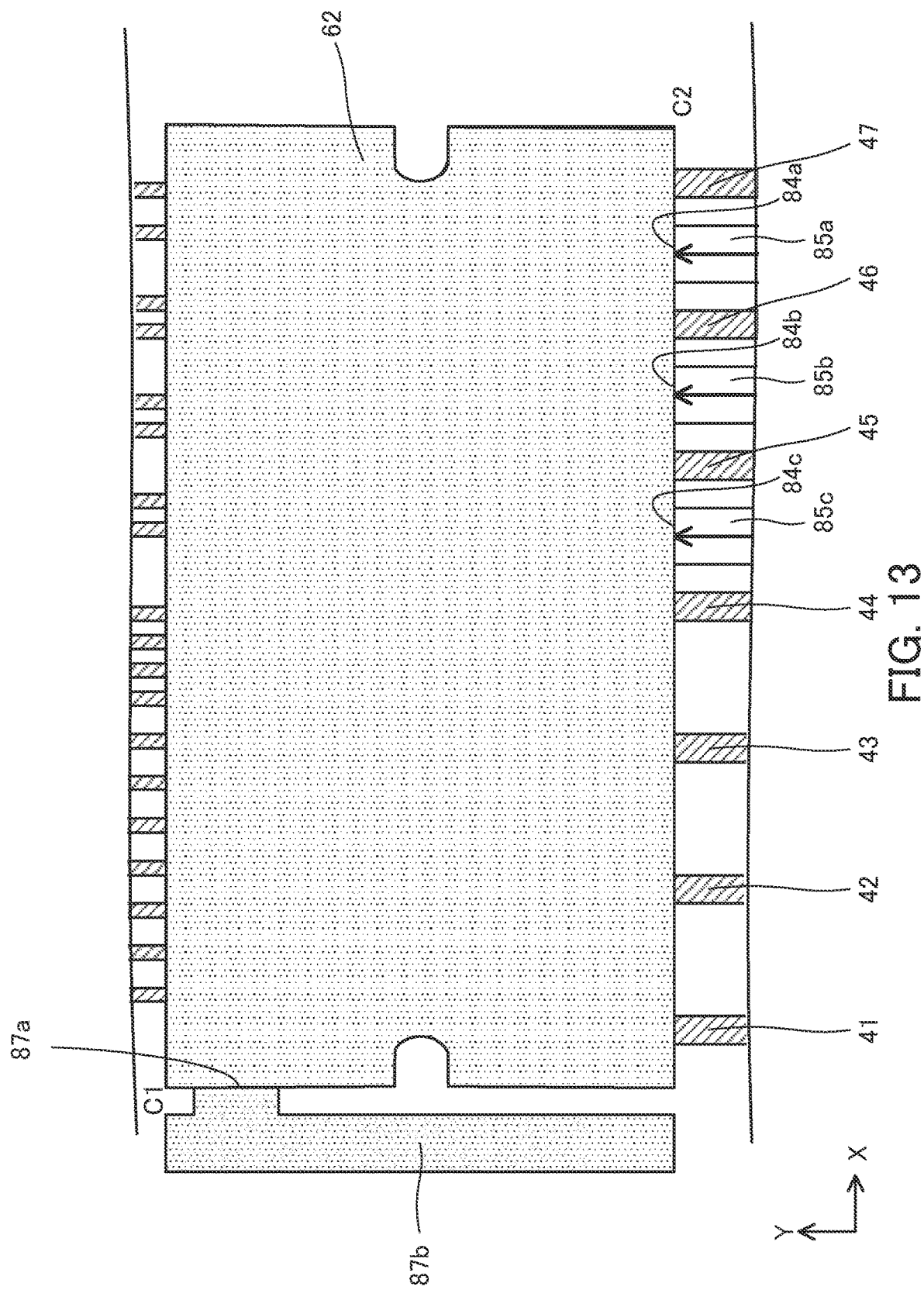
FIG. 13 is a fifth plan view illustrating the molding step included in the manufacturing method of the semiconductor device according to the embodiment.

As described above, when the cavity 83 is filled with the molding resin raw material 62 as illustrated in FIG. 13, the pressing portions (the pressing portions 86a and 86b in FIG. 7) are moved in the upper direction of the mold 80 to release the pressing on the main die pad portions 44a to 47a.

Next, the injection of the molding resin raw material 62 is stopped, and the mold 80 is opened, to extract the semi-hard molded body from the mold 80. This semi-hard molded body is obtained by sealing the semiconductor chips 21 to 24, the main current lead frames 40, the control lead frames 30, the semi-hard insulating sheet 70, etc. with the semi-hard molding resin raw material 62. The rear surface of the semi-hard insulating sheet 70 is exposed to the outside such that the rear surface of the semi-hard insulating sheet 70 are on the same plane with the rear surface of the molded body. In addition, after the pressing portions are pulled upward, the concave portions 60b are formed at the locations where the pressing portions have been located on the front surface of the molding resin raw material 62 (see FIG. 1B). Convex portions may be formed at the locations where the pressing portions have been located on the front surface of the molding resin raw material 62.

The next step is a curing step (step S6 in FIG. 5). First, the semi-hard molded body extracted from the molding apparatus is conveyed to a heating apparatus. Next, the semi-hard molded body conveyed to the heating apparatus is heated at a predetermined temperature. The heating temperature is between 120° C. and 180° C., inclusive. The molded body is consequently cured. The molding resin extending from the inlets 84a to 84c and the outlet 87a is cut off from the molded body. Thus, the inlets 84a to 84c become the injection cut-off surfaces 60c, and the outlet 87a becomes the discharge cut-off surface 60d. The injection cut-off surfaces 60c and the discharge cut-off surface 60d are coarser and more radiant than their surrounding surfaces. In the present curing step, after the semi-hard molded body is extracted from the mold 80, the semi-hard molded body is conveyed to the heating apparatus and is heated at a predetermined temperature in the heating apparatus. However, alternatively, the molded body may be cured inside the mold 80 by heating the molded body at a predetermined temperature for a predetermined time.

Thus, the semiconductor device 10, which is illustrated in FIGS. 1 to 4 and includes the cured molding resin 60, is manufactured. After or before the curing step (step S6 in FIG. 5), members that are not needed, such as a tie bar, may be removed from the metal plate including members corresponding to the main current lead frames 40 and the control lead frames 30. In addition, a step of bending the terminal portions of the main current lead frames 40 and the control terminal portions of the control lead frames 30 may be performed.

The above manufacturing method of the semiconductor device 10 includes a step of preparing components constituting the semiconductor device 10, a mounting step of mounting a semiconductor chip 21 on the main die pad portion 44a and the control IC 50h on the control die pad portion 38a1, and a disposition step of disposing a metal plate on the mold 80 such that the semiconductor chip 21 and the control IC 50h are stored in the cavity 83 in a plan view. In addition, the manufacturing method includes a molding step of injecting the molding resin raw material 62 into the cavity 83 from the inlets 84a to 84c, filling the cavity 83 with the molding resin raw material 62, discharging excessive molding resin raw material 62 from the outlet 87a, and sealing the metal plate on which the semiconductor chip 21 and the control IC 50h are mounted. In the case of the semiconductor device 10 manufactured in this way, at least, generation of voids is reduced in the area around the semiconductor chip 21 and the control IC 50h. Thus, since occurrence of an electrical discharge is reduced in the semiconductor device 10, the deterioration of the reliability of the semiconductor device 10 is prevented.

The technique discussed above reduces the occurrence of voids and consequently reduces the deterioration of the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method comprising:
   preparing a molding resin raw material, a mold, a metal plate, a first semiconductor chip and a first control element, wherein
   the mold includes
      first and second long mold sides parallel to each other and third and fourth short mold sides parallel to each other, together forming a storage having a rectangular shape in a plan view of the mold,
      a plurality of inlets for the molding resin raw material formed in the first long mold side at a position closer to the fourth short mold side than to the third short mold side, and
      an outlet for the molding resin raw material, formed in the third short mold side at a position closer to the second long mold side than to the first long mold side,
   the metal plate having first and second long plate sides parallel to each other and third and fourth short plate sides parallel to each other, the metal plate including
      a first main die pad portion disposed at a position closer to the first long plate side than to the second long plate side,
      a plurality of first main current terminal portions integrally formed with the first main die pad portion and being extendable outside the mold from the first long mold side, each of the plurality of inlets being located between a corresponding adjacent two of the plurality of first main current terminal portions,
      a first control die pad portion disposed between the first main die pad portion and the second long plate side, and
      a first control terminal portion integrally formed with the first control die pad portion and being extendable outside of the mold from the second long mold side;
   mounting the first semiconductor chip on the first main die pad portion and mounting the first control element on the first control die pad portion;
   disposing the metal plate in the mold such that the first semiconductor chip and the first control element are stored in the storage; and
   sealing the metal plate on which the first semiconductor chip and the first control element are mounted by injecting the molding resin raw material into the storage from the plurality of inlets, filling the storage with the molding resin raw material, and discharging excessive molding resin raw material from the outlet.

2. The semiconductor device manufacturing method according to claim 1, wherein the mounting further includes electrically connecting the first semiconductor chip and the first control element by using a plurality of first control wires after the mounting of the first semiconductor chip and the first control element.

3. The semiconductor device manufacturing method according to claim 2, wherein each of the plurality of first control wires extends from the first long mold side to the second long mold side.

4. A semiconductor device manufacturing method, comprising
preparing a molding resin raw material, a mold, a metal plate, a first semiconductor chip and a first control element, wherein
the mold includes
first and second long mold sides parallel to each other and third and fourth short mold sides parallel to each other, together forming a storage having a rectangular shape in a plan view of the mold,
an inlet for the molding resin raw material formed in the first long mold side at a position closer to the fourth short mold side than to the third short mold side, and
an outlet for the molding resin raw material, formed in the third short mold side at a position closer to the second long mold side than to the first long mold side,
the metal plate having first and second long plate sides parallel to each other and third and fourth short plate sides parallel to each other, the metal plate including
a first main die pad portion disposed at a position closer to the first long plate side than to the second long plate side,
a first main current terminal portion integrally formed with the first main die pad portion and being extendable outside the mold from the first long mold side,
a first control die pad portion disposed between the first main die pad portion and the second long plate side, and
a first control terminal portion integrally formed with the first control die pad portion and being extendable outside of the mold from the second long mold side;
mounting the first semiconductor chip on the first main die pad portion and mounting the first control element on the first control die pad portion;
disposing the metal plate in the mold such that the first semiconductor chip and the first control element are stored in the storage; and
sealing the metal plate on which the first semiconductor chip and the first control element are mounted by injecting the molding resin raw material into the storage from the inlet, filling the storage with the molding resin raw material, and discharging excessive molding resin raw material from the outlet, wherein
the mounting further includes electrically connecting the first semiconductor chip and the first control element by using a plurality of first control wires after the mounting of the first semiconductor chip and the first control element,
each of the plurality of first control wires extends from the first long mold side to the second long mold side,
the metal plate further includes
a second main die pad portion disposed at a position closer than the first main die pad portion to the third short plate side,
a second main current terminal portion integrally formed with the second main die pad portion and being extendable outside of the mold from the first long mold side,
a second control die pad portion formed between the second long plate side and the second main die pad portion, and
a second control terminal portion integrally formed with the second control die pad portion and being extendable outside of the mold from the second long mold side,
the preparing further includes preparing a second semiconductor chip and a second control element,
the mounting further includes mounting the second semiconductor chip on the second main die pad portion and mounting the second control element on the second control die pad portion, and
the electrically connecting further includes connecting the second semiconductor chip and the second control element by using a plurality of second control wires.

5. The semiconductor device manufacturing method according to claim 4, wherein each of the plurality of second control wires extends from the first long mold side to the second long mold side and connects the second semiconductor chip and the second control element.

6. The semiconductor device manufacturing method according to claim 5, wherein the first semiconductor chip and the first control element are mounted in a high side area of the semiconductor device, which is a control wiring area for controlling an upper arm, and the second semiconductor chip and the second control element are mounted in a low side area of the semiconductor device, which is a control wiring area for controlling a lower arm.

7. The semiconductor device manufacturing method according to claim 6, wherein a distance between an adjacent two of the plurality of first control wires that are adjacent to each other is shorter than a distance between an adjacent two of the plurality of second control wires that are adjacent to each other.

8. The semiconductor device manufacturing method according to claim 1, wherein the molding resin raw material contains a semi-hard epoxy resin.

9. A semiconductor device having a molding area that has a rectangular shape in a plan view of the semiconductor device with first and second long sides parallel to each other and third and fourth short sides parallel to each other, the semiconductor device comprising:
a first semiconductor chip and a second semiconductor chip;
a first control element and a second control element;
a first main current lead frame including
a first main die pad portion, having a front surface on which the first semiconductor chip is mounted, the first main die pad portion being disposed in a bottom right area of the molding area, said bottom right area being closer to the first long side than to the second long side and being closer to the fourth short side than to the third short side, and
a first main current terminal portion integrally formed with the first main die pad portion and extending outside the mold area from the first long side;
a second main current lead frame including
a second main die pad portion having a front surface on which the second semiconductor chip is mounted, the second main die pad portion being disposed in a bottom left area of the molding area that is closer to the first long side than to the second long side and is closer to the third short side than to the fourth short side, and a second main current terminal portion integrally formed with the second main die pad portion and extending outside the mold area from the second long side;

a first control lead frame including a first control die pad portion on which the first control element is mounted, the first control die pad portion being disposed in a top right area of the molding area that is closer to the second long side than to the first long side and closer to the fourth short side than to the third short side, and a first control terminal portion integrally formed with the first control die pad portion and extending outside the mold area from the second long side;

a second control lead frame including a second control die pad portion on which the second control element is disposed, the second control die pad portion being disposed in a top left area of the molding area that is closer to the second long side than to the first long side and closer to the third short side than to the fourth short side and a second control terminal portion integrally formed with the second control die pad portion and extending outside the mold area from the second long side;

a plurality of first control wires each connecting the first semiconductor chip and the first control element within the molding area;

a plurality of second control wires each connecting the second semiconductor chip and the second control element within the molding area;

a rectangular molding resin sealing the molding area of the semiconductor device and having first and second long mold sides parallel to and provided to respectively correspond to the first and second long sides, and third and fourth short mold sides parallel to and provided to respectively correspond to the third and fourth short sides; and a plurality of injection cut-off surfaces formed on the first long mold side.

10. The semiconductor device according to claim 9, wherein the first main current terminal portion is provided in plurality, and each of the plurality of injection cut-off surfaces is formed between an adjacent two of the first main current terminal portions that are adjacent to each other at the first long mold side.

11. The semiconductor device according to claim 10, wherein each of the plurality of injection cut-off surfaces is formed between the second main current terminal portion and one of the first main current terminal portions on the first long mold side.

12. The semiconductor device according to claim 9, further comprising a discharge cut-off surface formed on the third short mold side at a position closer to the second long mold side than to the first long mold side.

13. The semiconductor device according to claim 9, wherein the plurality of first control wires each extend from the first long side to the second long side and electrically connect the first semiconductor chip and the first control element, and wherein the plurality of second control wires each extend from the first long side to the second long side and electrically connect the second semiconductor chip and the second control element.

14. The semiconductor device according to claim 13, wherein the plurality of second control wires are curved toward the third short mold side more than are the plurality of first control wires.

15. The semiconductor device according to claim 14, wherein a distance between an adjacent two of the plurality of first control wires that are adjacent to each other is smaller than a distance between an adjacent two of the plurality of second control wires that are adjacent to each other.

16. The semiconductor device according to claim 9, wherein the right and left side areas of the molding resin include voids, and a total volume of the voids included in the right side area is less than a total volume of the voids included in the left side area.

17. The semiconductor device according to claim 16, wherein the molding resin contains a semi-hard epoxy resin.

\* \* \* \* \*